(12) United States Patent
Kawano et al.

(10) Patent No.: US 9,018,073 B2
(45) Date of Patent: Apr. 28, 2015

(54) METHOD OF MANUFACTURING A SEMICONDUCTOR DEVICE INCLUDING ALIGNMENT MARK

(71) Applicant: Fujitsu Semiconductor Limited, Yokohama, Kanagawa (JP)

(72) Inventors: Makoto Kawano, Kuwana (JP); Shigeki Yoshida, Ichinomiya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/749,019

(22) Filed: Jan. 24, 2013

(65) Prior Publication Data

US 2013/0277756 A1    Oct. 24, 2013

(30) Foreign Application Priority Data

Apr. 18, 2012  (JP) .................... 2012-094623

(51) Int. Cl.
| | | |
|---|---|---|
| *H01L 21/76* | (2006.01) | |
| *H01L 23/544* | (2006.01) | |
| *G03F 7/20* | (2006.01) | |
| *G03F 9/00* | (2006.01) | |
| *H01L 21/768* | (2006.01) | |
| *H01L 21/285* | (2006.01) | |

(52) U.S. Cl.
CPC .............. *H01L 23/544* (2013.01); *G03F 7/20* (2013.01); *G03F 9/7073* (2013.01); *H01L 2223/5442* (2013.01); *H01L 2223/54426* (2013.01); *H01L 2223/5446* (2013.01); *H01L 21/28518* (2013.01); *H01L 21/76802* (2013.01); *H01L 2924/0002* (2013.01)

(58) Field of Classification Search
CPC .............. H01L 23/544; H01L 23/5446; H01L 2223/54426; H01L 2223/54453
USPC ..................... 257/384, 797; 438/401, 462
See application file for complete search history.

(56) References Cited

U.S. PATENT DOCUMENTS

| | | | | |
|---|---|---|---|---|
| 6,312,994 | B1 * | 11/2001 | Nakamura | 438/279 |
| 6,576,529 | B1 | 6/2003 | Boulin et al. | |
| 7,696,057 | B2 * | 4/2010 | Fried et al. | 438/401 |
| 2006/0223200 | A1 * | 10/2006 | Maruyama | 438/7 |
| 2007/0222089 | A1 * | 9/2007 | Maruyama | 257/797 |

FOREIGN PATENT DOCUMENTS

| | | |
|---|---|---|
| JP | 56-094741 A | 7/1981 |
| JP | 58-213425 A | 12/1983 |
| JP | 60-111424 A | 6/1985 |
| JP | 06-132202 A | 5/1994 |
| JP | 11-054607 A | 2/1999 |
| JP | 2001-217187 A | 8/2001 |
| JP | 2005-340321 A | 12/2005 |

* cited by examiner

*Primary Examiner* — Thao X Le
*Assistant Examiner* — Gardner W Swan
(74) *Attorney, Agent, or Firm* — Westerman, Hattori, Daniels & Adrian, LLP

(57) ABSTRACT

A method of manufacturing a semiconductor device includes: forming a recessed portion in a semiconductor substrate; forming an insulating film in the recessed portion; after forming the insulating film, forming a silicide layer on the semiconductor substrate in contact with the insulating film; and performing alignment between an electron beam exposure apparatus and the semiconductor substrate by using the insulating film and the silicide layer as an alignment mark.

8 Claims, 29 Drawing Sheets

_US 9,018,073 B2_

METHOD OF MANUFACTURING A SEMICONDUCTOR DEVICE INCLUDING ALIGNMENT MARK

CROSS-REFERENCE TO RELATED APPLICATION

This application is based upon and claims the benefit of priority of the prior Japanese Patent Application No. 2012-94623, filed on Apr. 18, 2012, the entire contents of which are incorporated herein by reference.

FIELD

The embodiments discussed herein are related to a semiconductor device and a method of manufacturing the same.

BACKGROUND

As exposure apparatuses for exposing a resist, there are a light exposure apparatus and an electron beam exposure apparatus. Among these, the electron beam exposure apparatus is suitable for small-quantity production such as that for engineering samples. This is because, unlike the light exposure apparatus, the electron beam exposure apparatus uses no reticle, and therefore may save the time and cost to manufacture the reticle.

In an exposure step of the electron beam exposure apparatus, a semiconductor substrate and the electron beam exposure apparatus are aligned by using an alignment mark provided in the semiconductor substrate to prevent misalignment between the semiconductor substrate and the electron beam exposure apparatus.

Various types of alignment mark structures are proposed. By use of any of the structures, an electron beam is scanned over the semiconductor substrate and the intensity of reflected electrons from the alignment mark is checked. Since the intensity of reflected electrons varies between the alignment mark and other regions, it may be possible to identify the position of the alignment mark by monitoring the intensity of reflected electrons and to perform alignment between the semiconductor substrate and the electron beam exposure apparatus.

It is preferable to improve accuracy of the alignment to satisfactorily exploit a high resolution performance of the electron beam exposure.

[Patent Document 1] Japanese Laid-open Patent Publication No. 11-054607
[Patent Document 2] Japanese Laid-open Patent Publication No. 58-213425
[Patent Document 3] Japanese Laid-open Patent Publication No. 60-111424
[Patent Document 4] Japanese Laid-open Patent Publication No. 06-132202
[Patent Document 5] Japanese Laid-open Patent Publication No. 2005-340321
[Patent Document 6] Japanese Laid-open Patent Publication No. 56-094741

SUMMARY

An aspect of the following disclosure provides a method of manufacturing a semiconductor device, the method including: forming a recessed portion in a semiconductor substrate; forming an insulating film in the recessed portion; after forming the insulating film, forming a silicide layer on the semiconductor substrate in contact with the insulating film; and performing alignment between an electron beam exposure apparatus and the semiconductor substrate by using the insulating film and the silicide layer as an alignment mark.

Another aspect of the disclosure provides a semiconductor device including: a semiconductor substrate having a recessed portion; an insulating film formed in the recessed portion; and a silicide layer in contact with the insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before giving description of an embodiment, researches made by the inventors of this application will be described.

In the researches, problems of alignment marks which are used for electron beam exposure and which have various structures are examined.

First Example

FIGS. 1A to 1F are cross-sectional views of an alignment mark in the course of manufacturing thereof according to a first example.

Figure 1A:
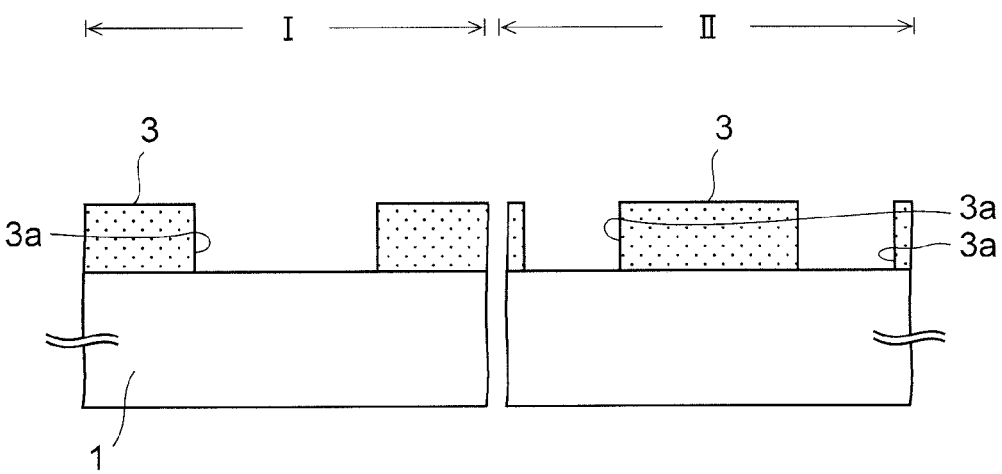
FIGS. 1A to 1F are cross-sectional views of an alignment mark in the course of manufacturing thereof according to a first example.

In the example, a first resist pattern 3 is formed on a silicon substrate 1 as illustrated in FIG. 1A.

The silicon substrate 1 has a scribe region I and a chip region II and the first resist pattern described above includes one or more first openings 3a in each of these regions.

Figure 1B:
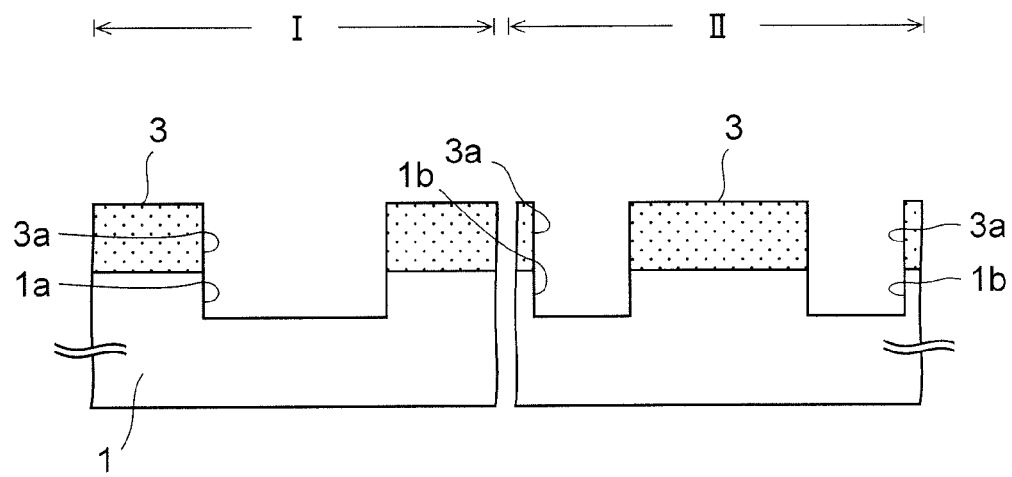

Then, as illustrated in FIG. 1B, the silicon substrate 1 is dry-etched through the first openings 3a to form a recessed portion 1a in the scribe region I and to form element isolation trenches 1b for STI (Shallow Trench Isolation) in the chip region II.

Thereafter, the first resist pattern 3 is removed.

Figure 1C:
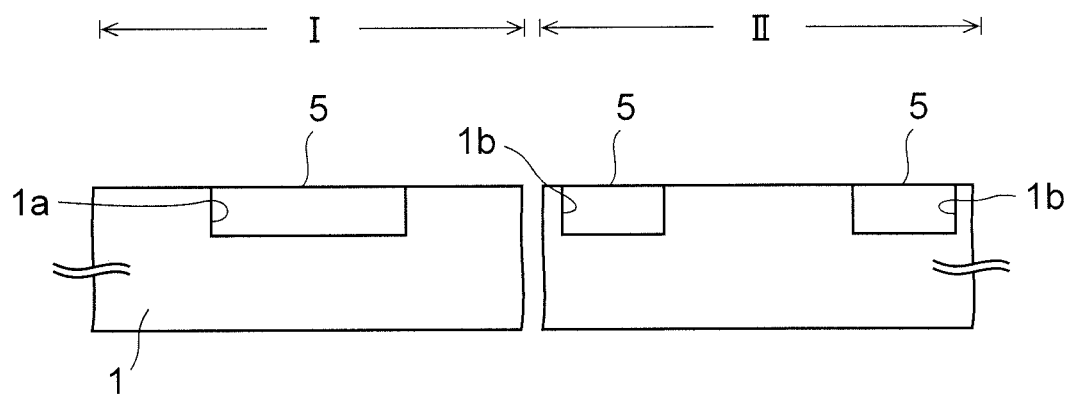

Next, as illustrated in FIG. 1C, a silicon oxide film is formed as an insulating film 5 over the top surface of the silicon substrate 1 by a CVD method. The recessed portion 1a and the element isolation trenches 1b are thus filled with the insulating film 5. Then, the unnecessary insulating film 5 on the top surface of the silicon substrate 1 is polished and removed by a CMP (Chemical Mechanical Polishing) method. The insulating film 5 thereby remains in the recessed portion 1a and the element isolation trenches 1b.

The insulating film 5 remaining in the element isolation trenches 1b serves as an element isolation insulating film defining an active region in the chip region II.

Figure 1D:
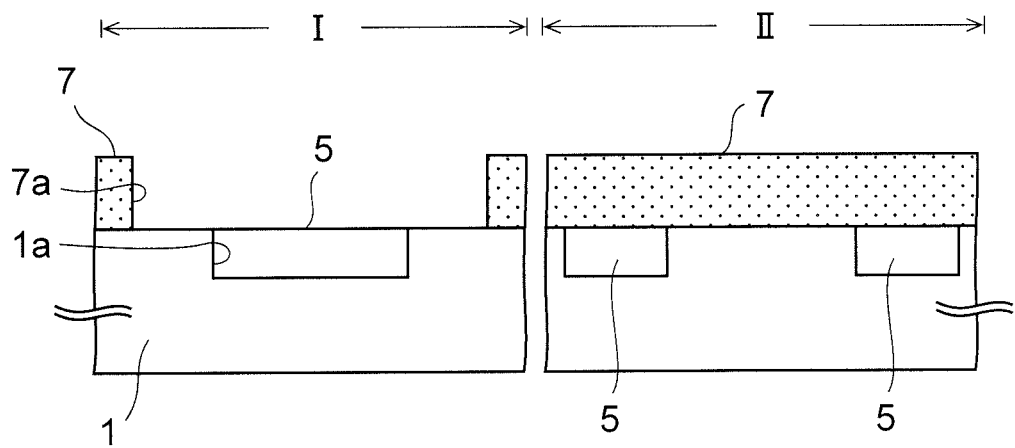

Subsequently, as illustrated in FIG. 1D, a second resist pattern 7 is formed on the silicon substrate 1. The second resist pattern 7 has a second opening 7a in the scribe region I and covers the entire surface of the chip region II, the second opening 7a including therein the recessed portion 1a.

Figure 1E:
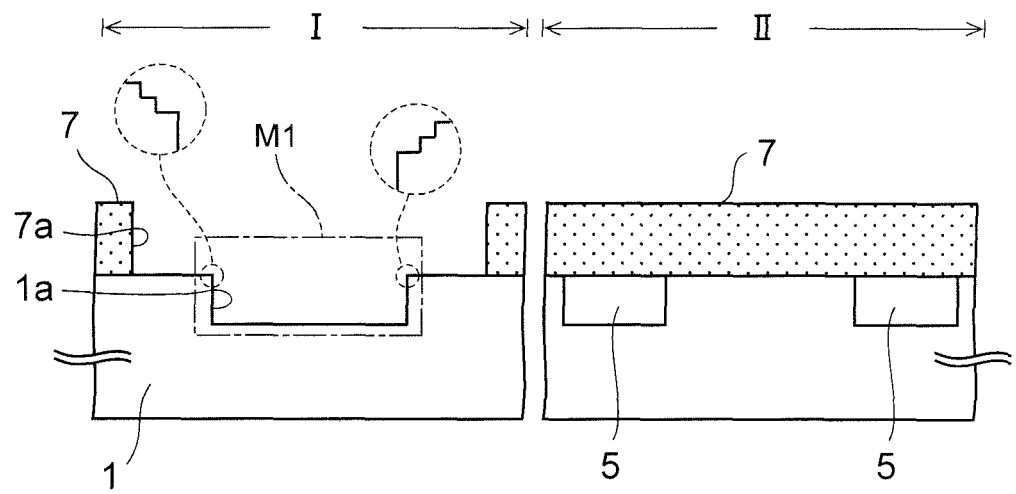

Then, as illustrated in FIG. 1E, the insulating film 5 in the recessed portion 1a is dry-etched and removed by RIE (Reactive Ion Etching) through the second opening 7a and the recessed portion 1a serves as an alignment mark M1.

A fluorocarbon gas such as $C_4F_6$ gas is used as an etching gas in the RIE. In this case, as illustrated in the dotted line circles, shoulder portions of the recessed portion 1a sometimes receive damages from an etching atmosphere and are chamfered.

Figure 1F:
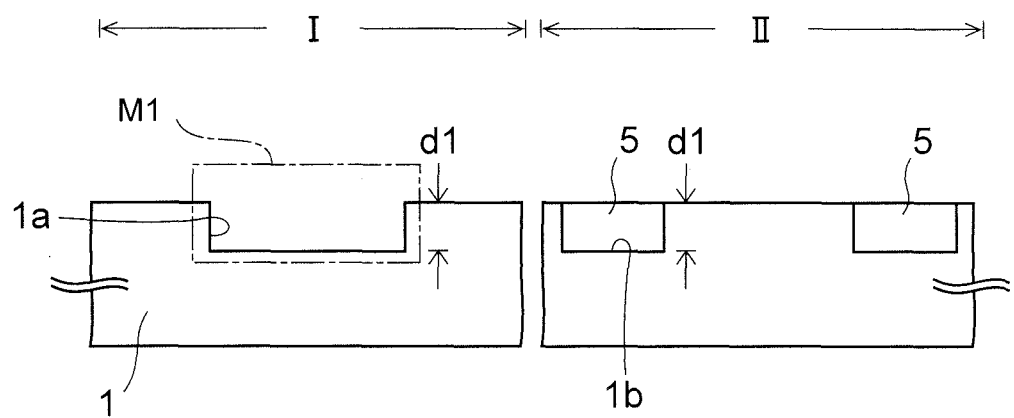

Thereafter, as illustrated in FIG. 1F, the second resist pattern 7 is removed.

Figure 2A:
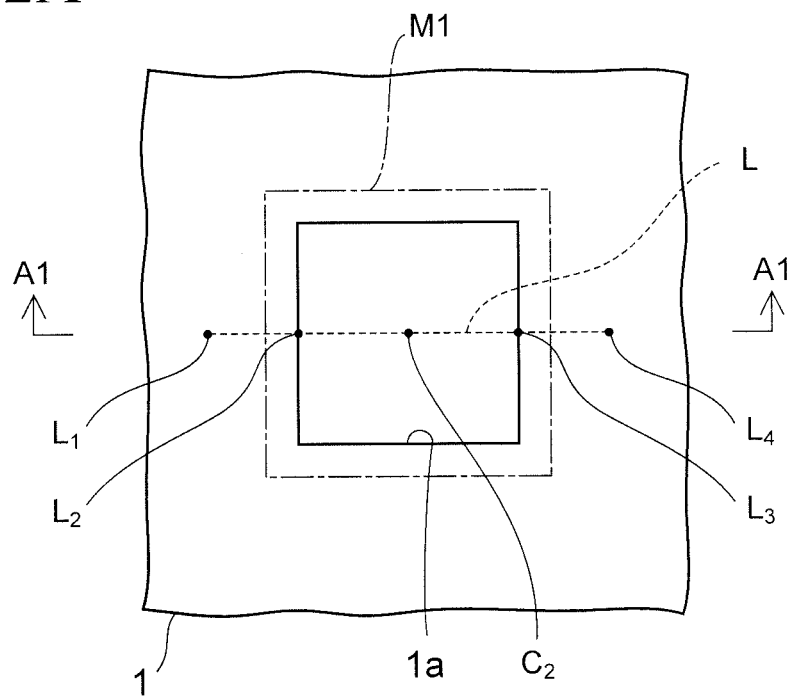
FIG. 2A is a plan view of the alignment mark according to the first example and FIG. 2B is a cross-sectional view of FIG. 2A taken along the line A1-A1.
Figure 2B:
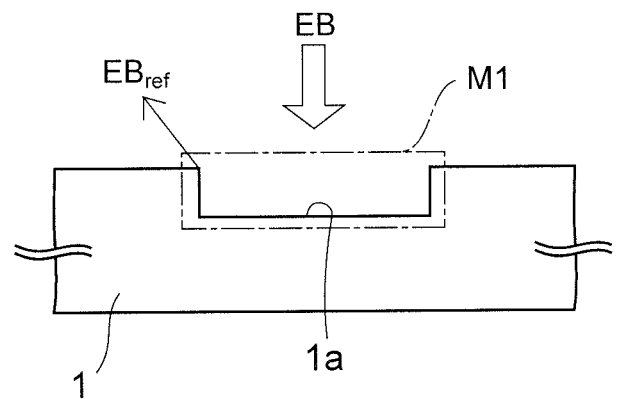

FIG. 2A is a plan view of the alignment mark M1 and FIG. 2B is a cross-sectional view of FIG. 2A taken along the line A1-A1.

As illustrated in FIG. 2A, a scanning line L crossing the alignment mark M1 is set at the time of alignment. In this example, both ends of the scanning line L are denoted by $L_1$ and $L_4$ and intersecting points between the scanning line L and the side surfaces of the recessed portion 1a are denoted by $L_2$ and $L_3$.

Then, as illustrated in FIG. 2B, an electron beam EB generated by an electron beam exposure apparatus is scanned along the scanning line L and the intensity of reflected electrons $EB_{ref}$ from the alignment mark M1 is monitored.

Figure 3A:
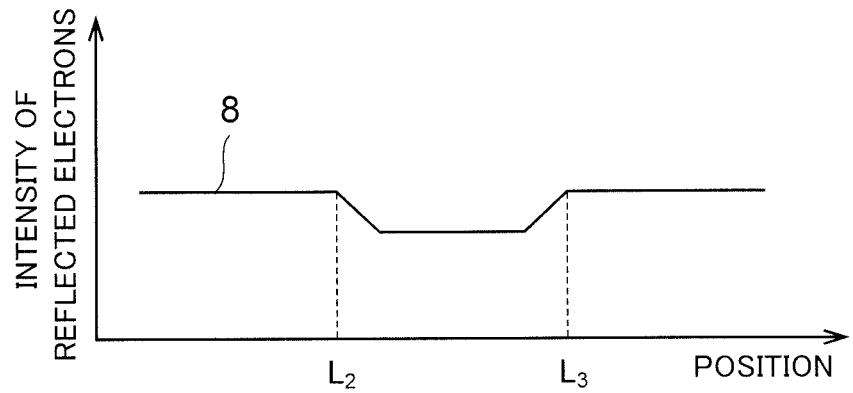
FIG. 3A illustrates a waveform representing the intensity of reflected electrons from the alignment mark according to the first example.

FIG. 3A illustrates a waveform 8 representing the intensity of reflected electrons $EB_{ref}$ and a horizontal axis of FIG. 3A represents a position on the scanning line L.

Figure 3B:
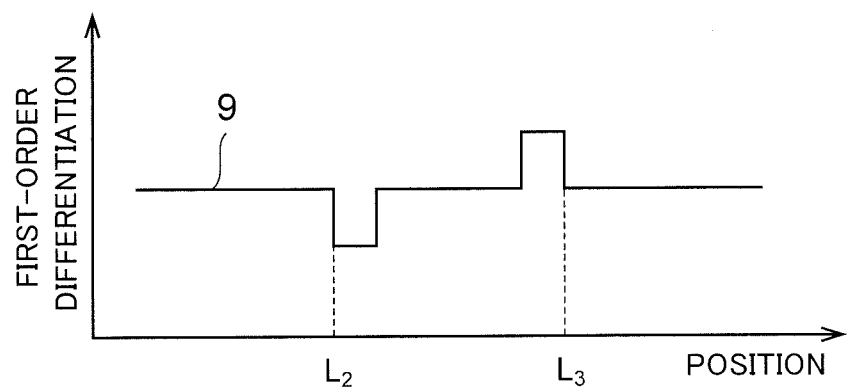
FIG. 3B illustrates a waveform obtained by performing first-order differentiation of the waveform of FIG. 3A with respect to position.
Figure 3C:
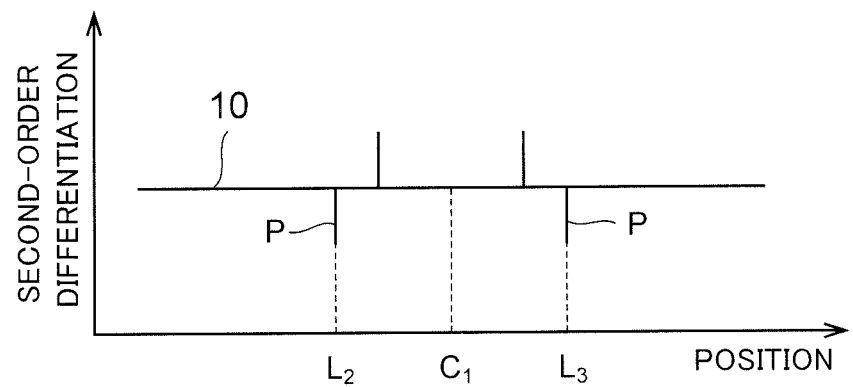
FIG. 3C illustrates a waveform obtained by performing second-order differentiation of the waveform of FIG. 3A with respect to position.

Moreover, FIG. 3B illustrates a waveform 9 obtained by performing first-order differentiation of the waveform 8 with respect to position and FIG. 3C illustrates a waveform 10 representing second-order differentiation of the waveform 8.

As illustrated in FIG. 3A, the shape of the waveform 8 changes at the points $L_2$ and $L_3$ due to difference in shape between the alignment mark M1 and the surface of the silicon substrate 1.

As illustrated in FIG. 3C, such changes in shape of the waveform 8 appear as peaks P in the waveform 10 obtained by performing second-order differentiation of the waveform 8. The electron beam exposure apparatus may recognize the position of the alignment mark M1 by identifying a midpoint $C_1$ of these peaks P as the center $C_2$ (see FIG. 2A) of the alignment mark M1.

Particularly, removing the insulating film 5 in the recessed portion 1a in the step of FIG. 1E may enable the shape of the recessed portion 1a to be detected with the electron beam EB more easily, and the peaks P thereby appear clearly.

However, in the case where the recessed portion 1a is used for the alignment mark M1 as described above, since the recessed portion 1a and the element isolation trenches 1b are formed simultaneously, the recessed portion 1a and the element isolation trenches 1b have the same depth d1 as illustrated in FIG. 1F.

Incidentally, the larger the depth of the recessed portion 1a is, the greater the change in the surface shape of the silicon substrate 1 is, and higher peaks P (see FIG. 3C) may be thereby obtained. However, when the element isolation trenches 1b are shallow, the recessed portion 1a is also shallow and the peaks P are thereby low.

A depth d2 is the depth of the recessed portion 1a for the electron beam exposure apparatus to clearly recognize the peaks P. When d1 described above is smaller than d2, the alignment using the peaks p is so difficult that accuracy of the alignment between the electron beam exposure apparatus and the silicon substrate 1 deteriorates.

Such a problem may rise when the depth d1 of the element isolation trenches 1b becomes smaller as a result of developments in technology.

Furthermore, when the amount of chamfer in the recessed portion 1a which occurs in the step of FIG. 1E is different between the two shoulder portions, the position of the midpoint $C_1$ of the two peaks P (see FIG. 3C) is displaced from the center $C_2$ (see FIG. 2A) of the alignment mark M1 and the alignment accuracy deteriorates.

Second Example

FIGS. 4A to 4E are cross-sectional views of an alignment mark in the course of manufacturing thereof according to a second example. In these drawings, elements which are the same as those described in the first example are denoted by the same reference numerals as in the first example and description thereof is omitted below.

Figure 4A:
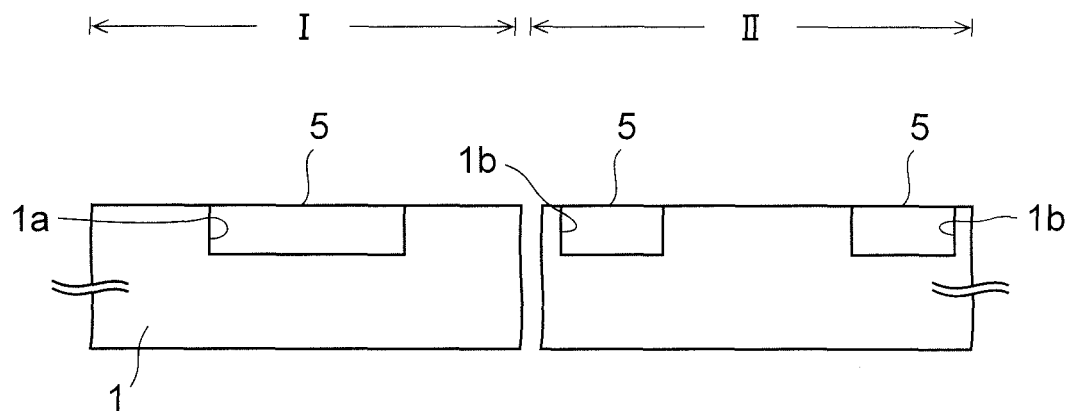
FIGS. 4A to 4E are cross-sectional views of an alignment mark in the course of manufacturing thereof according to a second example.

In the example, steps of FIGS. 1A to 1C of the first example are first performed to obtain a structure illustrated in FIG. 4A in which a recessed portion 1a and element isolation trenches 1b are filled with an insulating film 5.

Figure 4B:
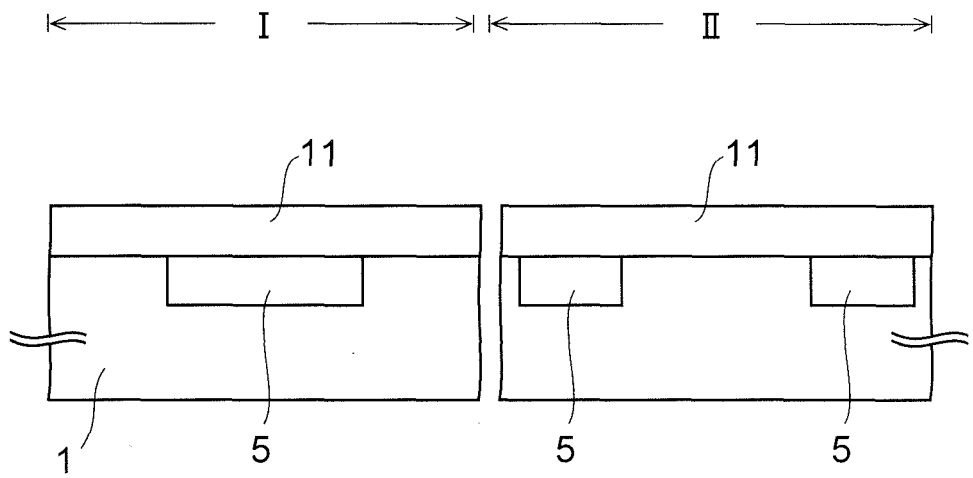

Then, as illustrated in FIG. 4B, a silicon oxide film is formed as an interlayer insulating film 11 over the top surface of a silicon substrate 1 by a CVD method.

Figure 4C:
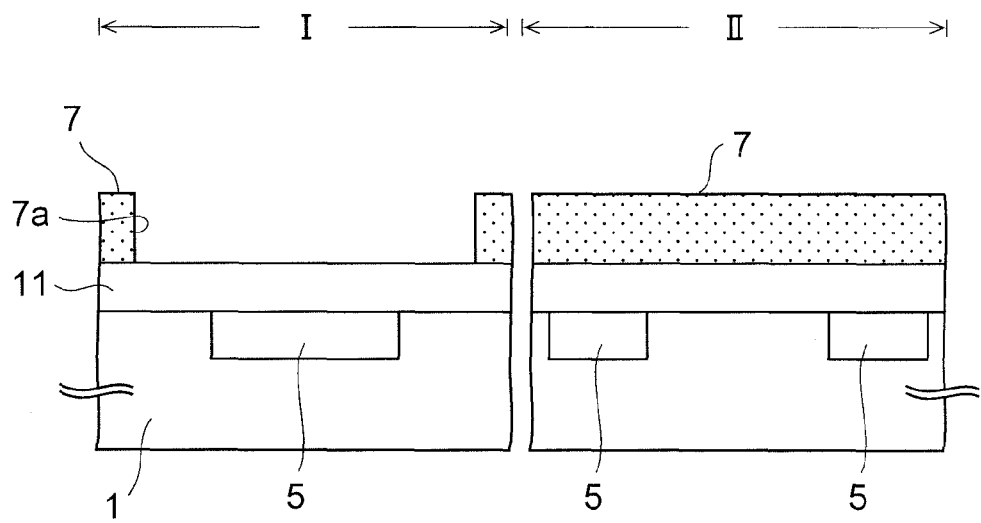

Next, as illustrated in FIG. 4C, a second resist pattern 7 described in the first example is formed in the scribe region I and the chip region II.

Figure 4D:
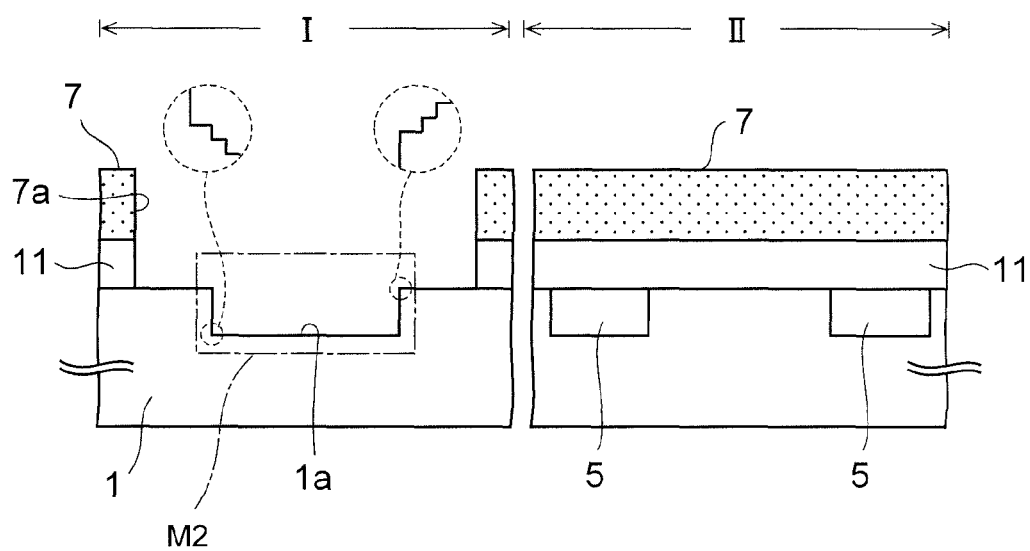

Subsequently, as illustrated in FIG. 4D, the insulating film 5 and the interlayer insulating film 11 are dry-etched through a second opening 7a of the second resist pattern 7. The recessed portion 1a from which the insulating film 5 is removed serves as an alignment mark M2.

The dry-etching is performed by RIE and a fluorocarbon gas such as $C_4F_6$ gas is used as an etching gas. In this case, as illustrated in the dotted line circles, the recessed portion 1a may lose its shape due to electrical discharge occurring in a dry-etching atmosphere. Particularly, it has become clear from this example that the loss of the shape due to electric discharge increases when etching is performed on the scribe region I whose proportion to the entire surface area of the silicon substrate 1 is smaller.

Figure 4E:
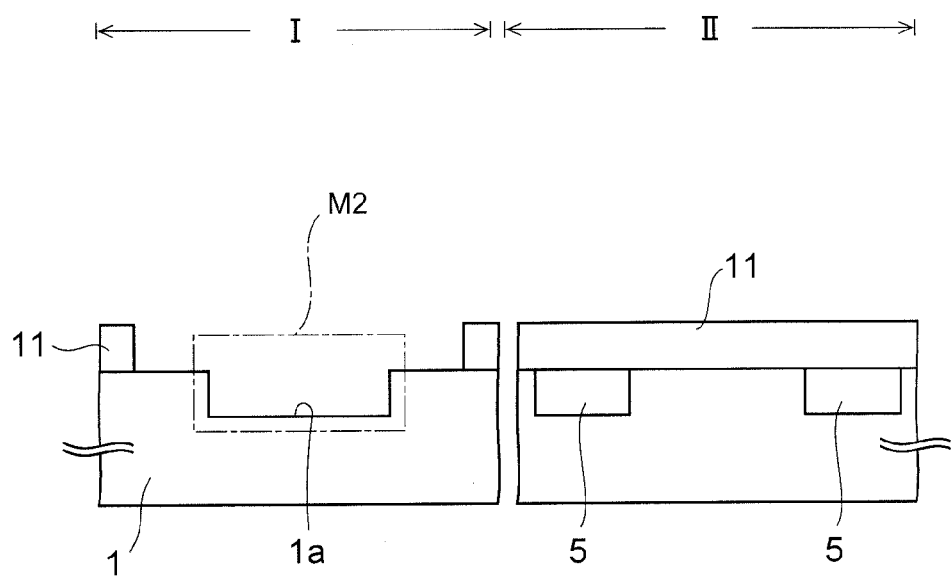

Thereafter, as illustrated in FIG. 4E, the second resist pattern 7 is removed.

In the alignment mark M2, like in the first example, the position of the midpoint $C_1$ (see FIG. 3C) of the two peaks P is displaced from the center of the alignment mark M2 due to the loss of shape of the recessed portion 1a described above. Hence, the accuracy of the alignment between the electron beam exposure apparatus and the silicon substrate 1 deteriorates.

Third Example

In the example, an alignment mark is made of a material other than silicon as described below.

FIGS. 5A to 5F are cross-sectional views of an alignment mark in the course of manufacturing thereof according to the example. In these drawings, elements which are the same as those described in the first and second examples are denoted by the same reference numerals as in the first and second examples and description thereof is omitted below.

Figure 5A:
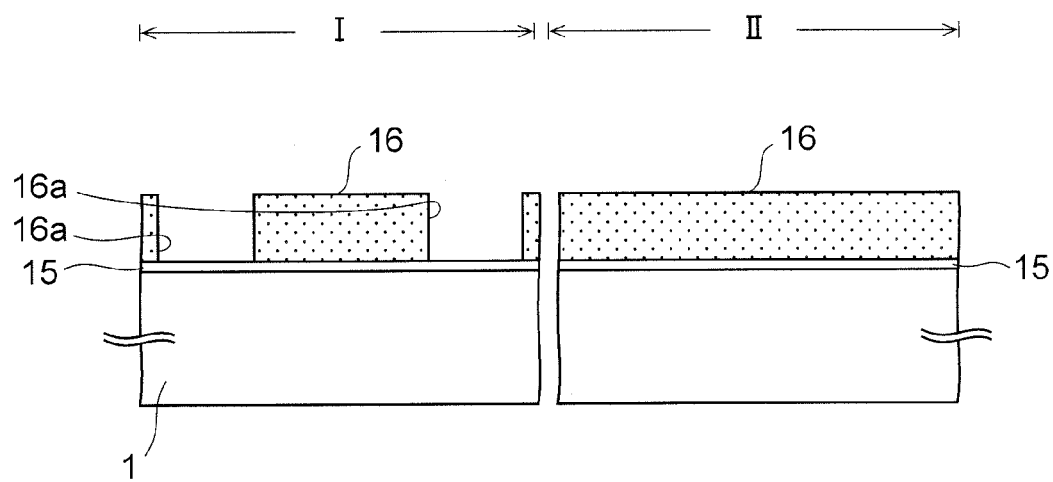
FIGS. 5A to 5F are cross-sectional views of an alignment mark in the course of manufacturing thereof according to a third example.

First, as illustrated in FIG. 5A, a thermal oxidation film 15 is formed by subjecting the surface of a silicon substrate 1 to thermal oxidation. Thereafter, a third resist pattern 16 is formed on the thermal oxidation film 15.

Figure 5B:
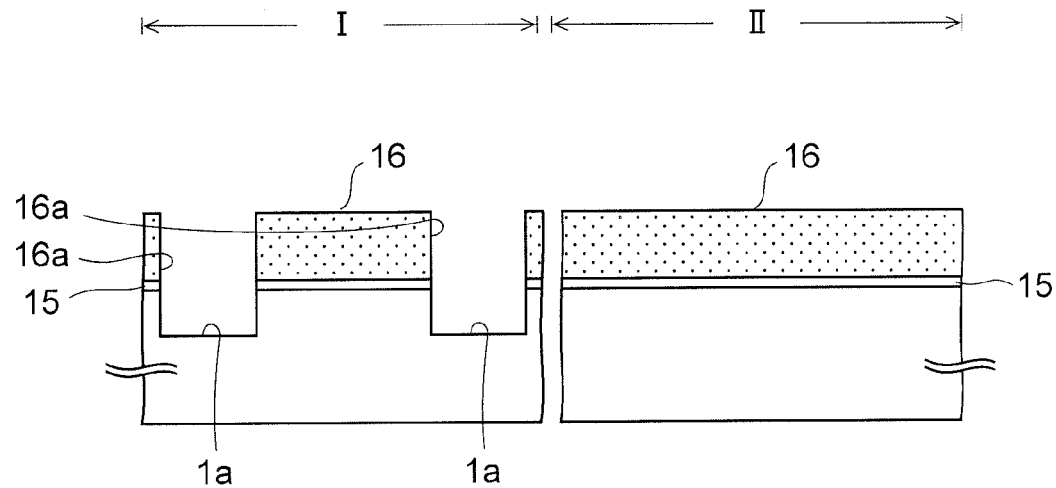

Then, as illustrated in FIG. 5B, the thermal oxidation film 15 and the silicon substrate are dry-etched through a third opening 16a included in the third resist pattern 16. A recessed portion 1a is thereby formed in the silicon substrate 1 in the scribe region I.

Since the entire surface of the chip region II is covered with the third resist pattern 16, the silicon substrate 1 in the chip region II is not etched in this step.

Thereafter, the third resist pattern 16 is removed.

Figure 5C:
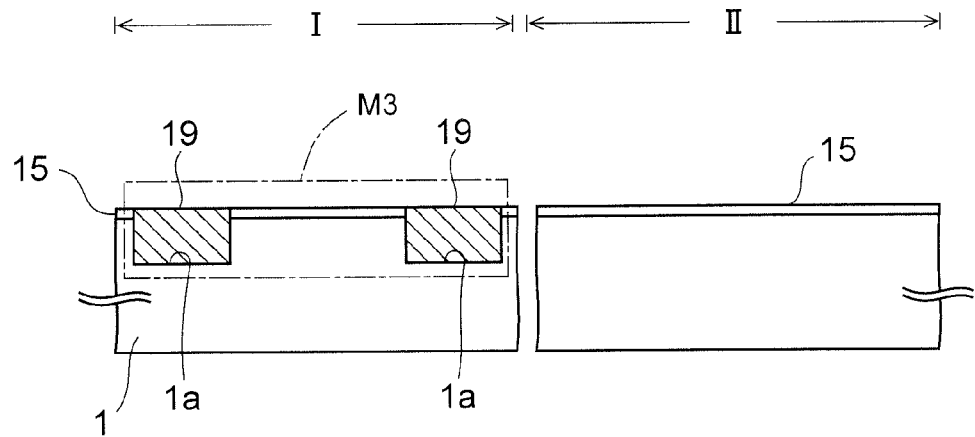

Next, as illustrated in FIG. 5C, a tungsten silicide film 19 is formed by a CVD method in the scribe region I and the chip region II and the recessed portion 1a is thus filled with the tungsten silicide film 19. Then, the unnecessary tungsten silicide film on the thermal oxidation film 15 is polished and removed by a CMP method. The tungsten silicide film 19 thereby remains in the recessed portion 1a.

In the example, the tungsten silicide film remaining in the recessed portion 1a is used as an alignment mark M3.

At the time point when the alignment mark M3 is formed as described above, no element isolation trenches are formed in the chip region II. Accordingly, processing hereafter proceeds to steps of forming the element isolation trenches in the chip region II.

Figure 5D:
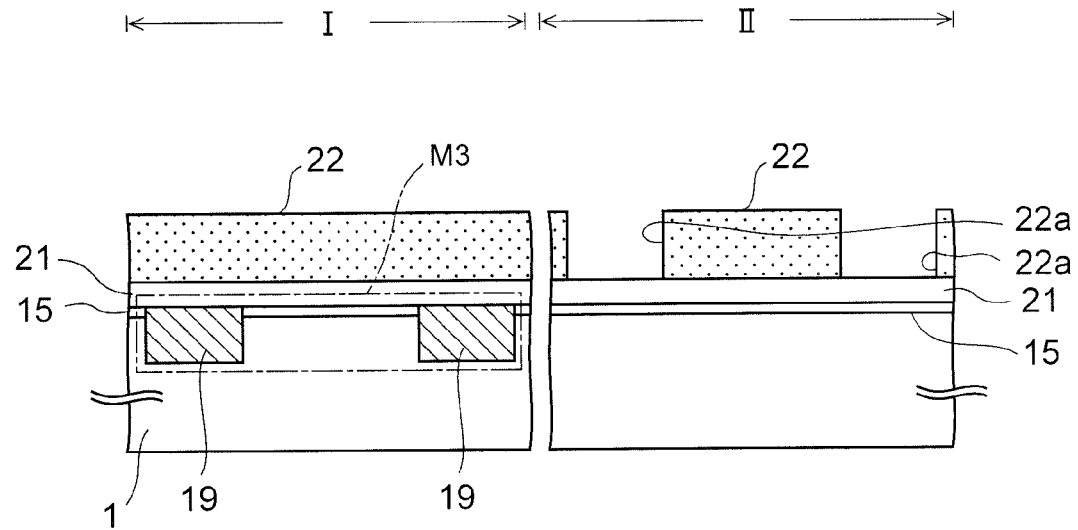

First, as illustrated in FIG. 5D, a silicon oxide film is formed as a mask insulating film 21 in the scribe region I and the chip region II by the CVD method. Then, a fourth resist pattern 22 is formed on the mask insulating film 21.

Figure 5E:
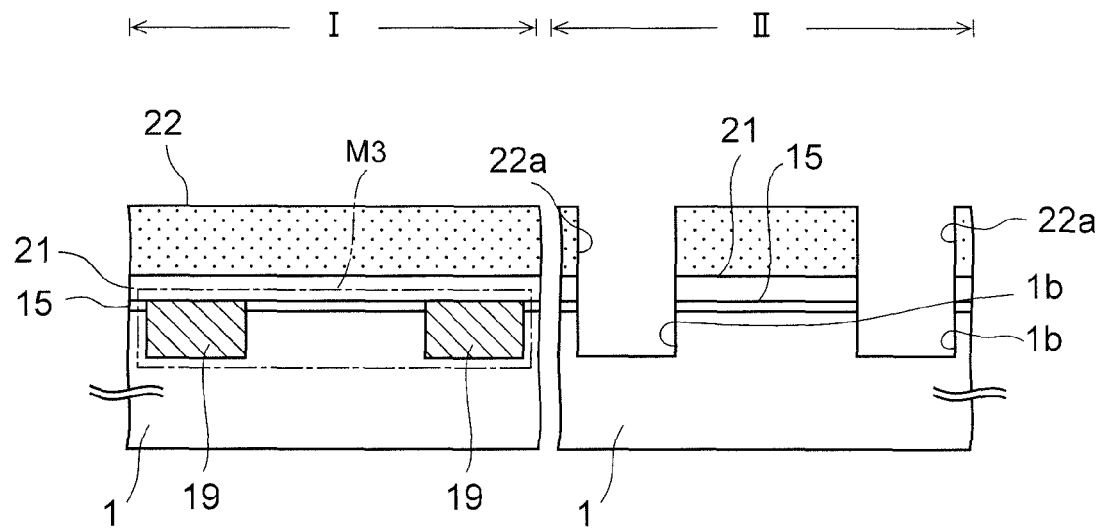

Next, as illustrated in FIG. 5E, the mask insulating film 21 and the thermal oxidation film 15 are dry-etched through fourth openings 22a of the fourth resist pattern 22 by RIE in which a fluorocarbon gas such as $C_4F_6$ gas is used as an etching gas.

Thereafter, the silicon substrate 1 is dry-etched by RIE with the mask insulating film 21 and the thermal oxidation film 15 used as a hard mask and the element isolation trenches 1b are thereby formed in the silicon substrate 1 in the chip region II.

Since the entire surface of the scribe region I is covered with the fourth resist pattern 22, no mask insulating film 21 in the scribe region I is etched in this step.

Thereafter, the fourth resist pattern 22 is removed.

Figure 5F:
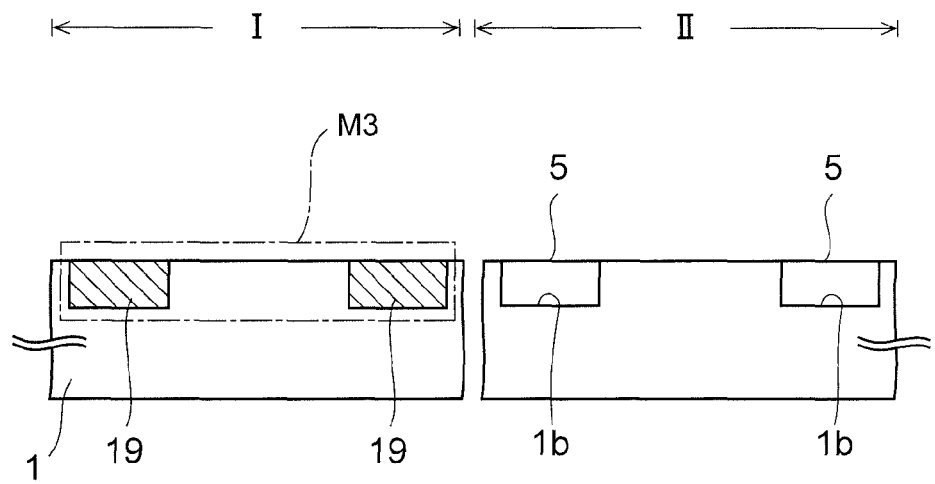

Next, steps performed to obtain a cross-sectional structure illustrated in FIG. 5F are described.

First, a silicon oxide film is formed as an insulating film 5 in the scribe region I and the chip region II by the CVD method and the element isolation trenches 1b are thus filled with the insulating film 5. Thereafter, the unnecessary thermal oxidation film 15, the unnecessary mask insulating film 21, and the unnecessary insulating film 5 on the silicon substrate 1 are removed by the CMP method. The insulating film 5 thus remains in the element isolation trenches 1b as an element isolation insulating film.

According to the example described above, the tungsten silicide film 19 made of a material different from that of the silicon substrate 1 therearound fills the recessed portion 1a as the alignment mark M3. Such difference in materials may enable clear recognition of the alignment mark M3 by use of reflected electrons as described below.

Figure 6A:
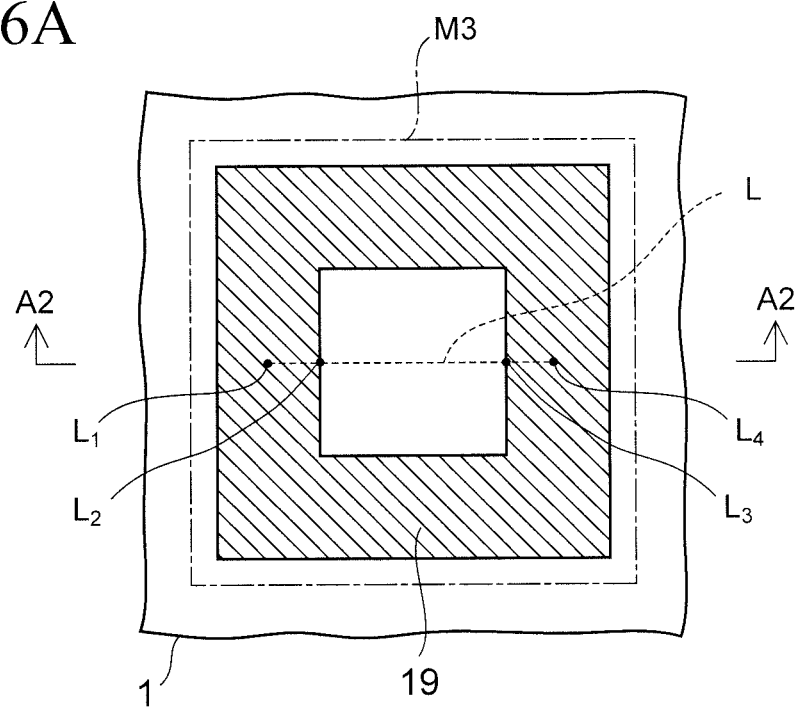
FIG. 6A is a plan view of the alignment mark according to the third example and FIG. 6B is a cross-sectional view of FIG. 6A taken along the line A2-A2.
Figure 6B:
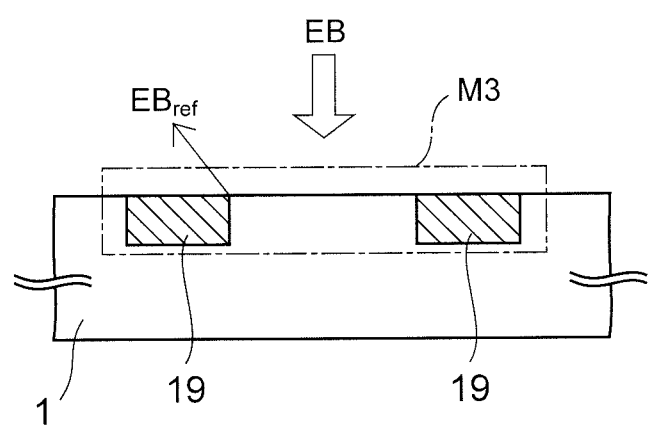

FIG. 6A is a plan view of the alignment mark M3 and FIG. 6B is a cross-sectional view of FIG. 6A taken along the line A2-A2.

As illustrated in FIG. 6A, like in the case of FIG. 2A, a scanning line L passing through points $L_1$ to $L_4$ is set also in the example.

Then, as illustrated in FIG. 6B, in the alignment, the intensity of reflected electrons $EB_{ref}$ generated when the electron beam EB is scanned along the scanning line L described above is monitored.

Figure 7A:
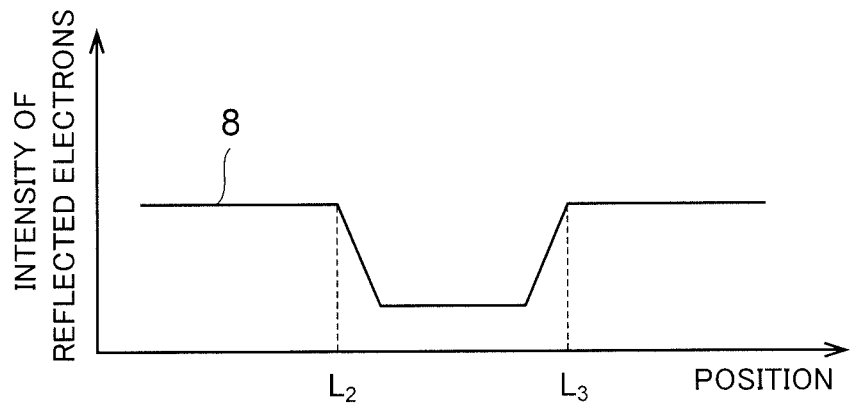
FIG. 7A illustrates a waveform representing the intensity of reflected electrons from the alignment mark according to the third example.
Figure 7B:
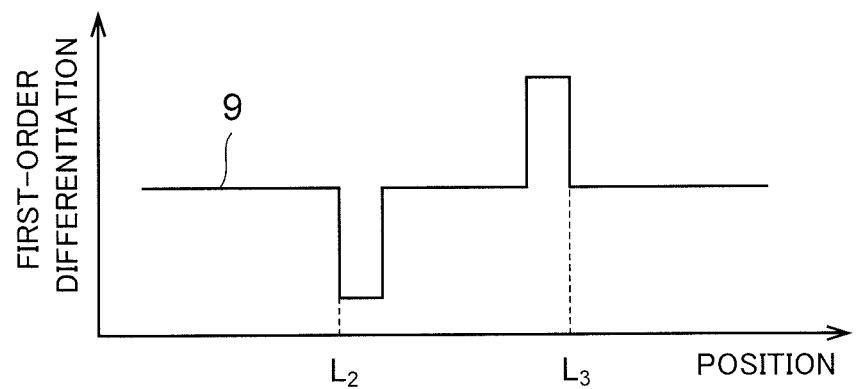
FIG. 7B illustrates a waveform obtained by performing first-order differentiation of the waveform of FIG. 7A with respect to position.
Figure 7C:
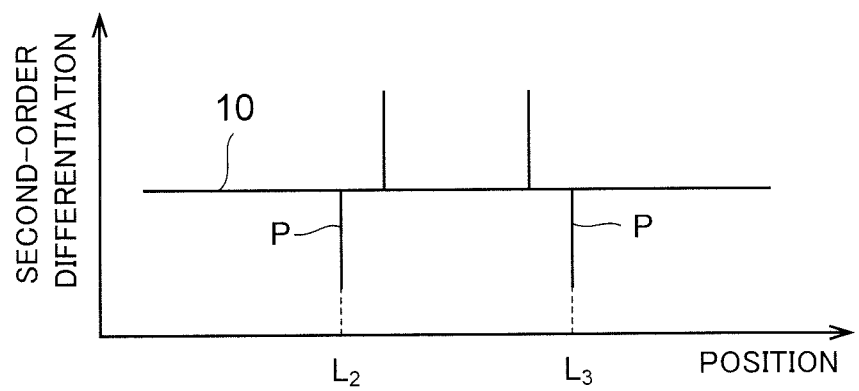
FIG. 7C illustrates a waveform obtained by performing second-order differentiation of the waveform of FIG. 7A with respect to position.

FIG. 7A illustrates a waveform 8 representing the intensity of the reflected electrons $EB_{ref}$, FIG. 7B illustrates a waveform 9 obtained by performing first-order differentiation of the waveform 8 with respect to position, and FIG. 7C illustrates a waveform 10 obtained by performing second-order differentiation of the waveform 8 with respect to position.

Since the alignment mark M3 is made of the material different from that of the silicon substrate 1 therearound as described above, the intensity of the reflected electrons $EB_{ref}$ around the points $L_2$ and $L_3$ corresponding to end portions of the alignment mark M3 changes greatly as illustrated in FIG. 7A.

Accordingly, the peaks P are high as illustrated in FIG. 7C. The electron beam exposure apparatus may thereby clearly recognize the peaks P and accurately perform alignment with respect to the silicon substrate 1.

Hence, when a device pattern such as a gate electrode is formed in the chip region II for example, excellent accuracy of alignment between the gate electrode and the alignment mark may be achieved by using the alignment mark M3.

However, since no tungsten silicide film 19 is formed as the device pattern in the chip region II, it may be impossible to perform direct alignment between the gate electrode and another device pattern such as the element isolation trenches 1b even if the alignment mark M3 is used.

As described above, the example has a problem that it is difficult to exactly overlay different device patterns one on top of another by direct alignment.

An embodiment is described below.

Embodiment

Figure 8:
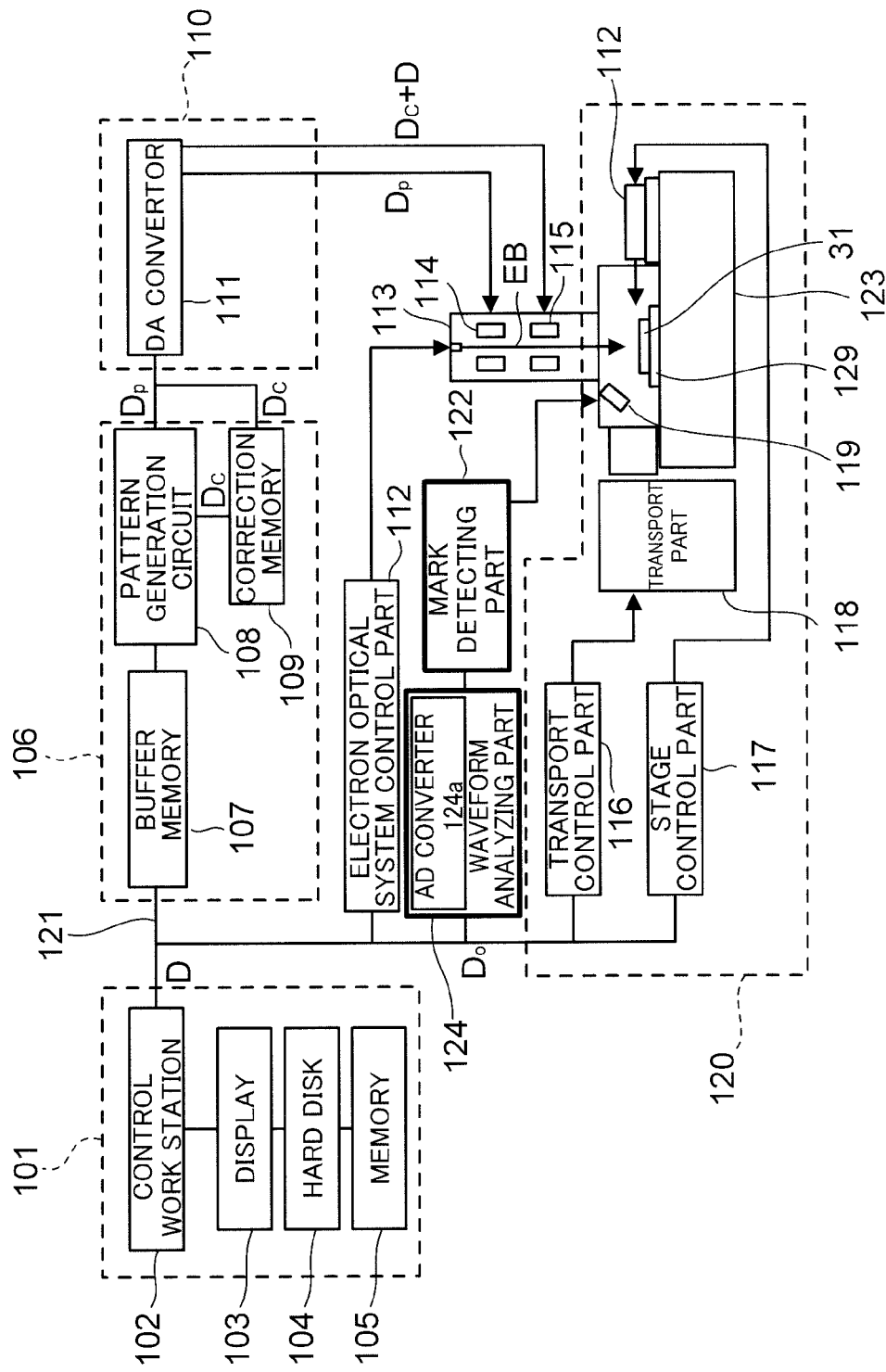
FIG. 8 is a configuration diagram of an electron beam exposure apparatus used in an embodiment.

FIG. 8 is a configuration diagram of an electron beam exposure apparatus used in the embodiment.

The exposure apparatus includes an integrated control system 101, a digital control system 106, an analog circuit 110, a mechanical system 120, and an electron optical system column 113 and performs exposure on a silicon substrate 31 in the electron optical system column 113.

The integrated control system 101 includes a control work station 102 as well as a display 103, a hard disk 104, and a memory 105 which are attached to the control work station 102. The integrated control system 101 exchanges data to and from the digital control system 106 and the mechanical system 120 via a bus 121. Such data includes, for example, later-described deflection data D for determining the amount of deflection of the electron beam which is generated by the control work station 102. The deflection data D is generated by the control work station 102 according to the shape and size of a device pattern such as a contact hole.

However, when the deflection data D alone is used without being corrected, a position irradiated with the electron beam is displaced from a target position, such as a position where the contact hole is to be formed, due to misalignment between the silicon substrate 31 and the electron beam exposure apparatus. In the embodiment, deflection correction data to be described later is used to prevent such misalignment.

Meanwhile, the digital control system 106 includes a buffer memory 107 for temporarily storing data inputted through the bus 121. Moreover, a pattern generation circuit 108 for generating a pattern of the electron beam in scanning of an alignment mark on the silicon substrate 31 is provided subsequent to the buffer memory 107. Pattern data $D_p$ corresponding to the pattern is outputted from the pattern generation circuit 108.

The pattern generation circuit 108 also has a function of generating deflection correction data $D_c$ for the electron beam EB on the basis of position data of the alignment mark obtained by scanning of the alignment mark. Then, the sum of the deflection correction data $D_c$ and the deflection data D is used as the corrected deflection data to irradiate the target position with the electron beam. The deflection correction data $D_c$ described above is stored in a correction memory 109.

The analog circuit 110 includes a DA convertor 111 which performs digital-analog conversion of the digital data $D_p$, $D_c$, and D described above and which amplifies the converted analog data.

The mechanical system 120 includes a transport part 118 which automatically transports the silicon substrate 31 into the electron optical system column 113 and an X-Y stage 129 on which to place the transported silicon substrate 31. The X-Y stage 129 has a structure isolated from vibration by a vibration isolator 123. In addition, the mechanical system 120 is provided with a transport control part 116 and a stage control part 117 which control the transport part 118 and the X-Y stage 129, respectively.

A detector 119 such as a PIN diode which receives the reflected electrons reflected by the alignment mark of the silicon substrate 31 is disposed above the X-Y stage 129. A voltage signal outputted from the detector 119 is amplified by a mark detecting part 122 and then converted to a digital value by an AD convertor 124a. The waveform analyzing part 124 then determines the position of the alignment mark on the basis of the digital value.

The electron optical system column 113 has a size adjusting deflector 114 to which the pattern data $D_p$ subjected to analog conversion is inputted. A plan size of the electron beam EB is adjusted by the deflector 114. Furthermore, a position deflector 115 to which the pattern data $D_c$ subjected to analog conversion is inputted is disposed in the electron optical system column 113. The deflection position of the electron beam EB is adjusted by the position deflector 115.

Acceleration energy and the like of the electron beam EB in the electron optical system column 113 are adjusted by an electron optical system control part 112.

In the embodiment, a semiconductor device is manufactured in the following way by using the above-described electron beam exposure apparatus.

Figure 9:
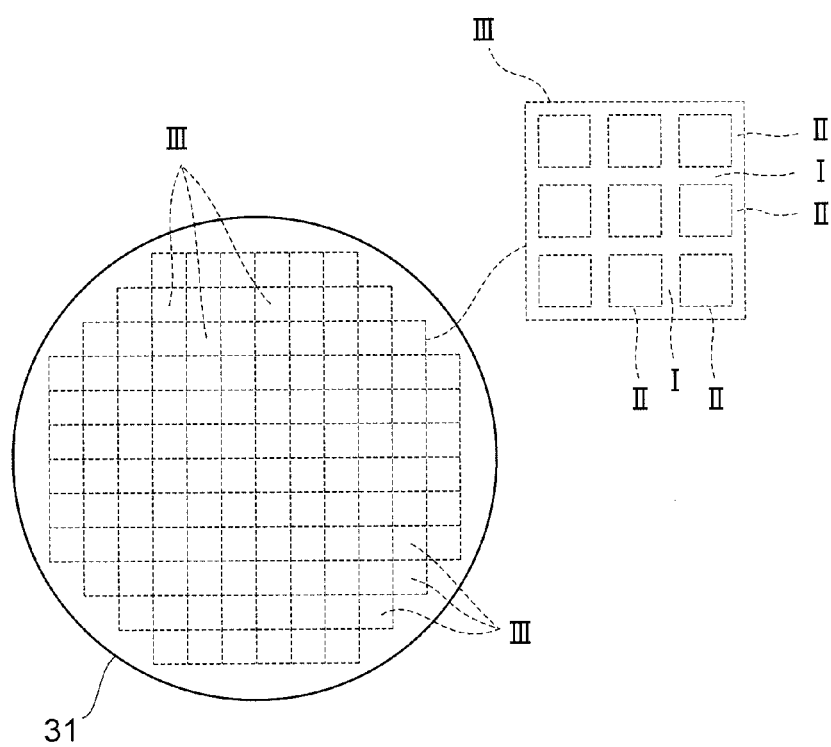
FIG. 9 is a plan view of a silicon substrate used in the embodiment.

FIG. 9 is a plan view of the silicon substrate 31 used in the embodiment. FIGS. 10A to 10M are cross-sectional views of the semiconductor device in the course of manufacturing thereof according to the embodiment.

In the embodiment, as illustrated in FIG. 9, the silicon substrate 31 including a plurality of rectangular shot regions III is used. Note that the silicon substrate 31 is an example of a semiconductor substrate.

Each of the shot regions III is a unit of exposure in the case of optically performing the exposure by using a reticle, and is provided therein with a plurality of chip regions II which are each a unit of dicing in singulation.

The chip regions II are isolated from one another by the scribe region I and the alignment mark is formed in the scribe region I as described below.

Figure 10A:
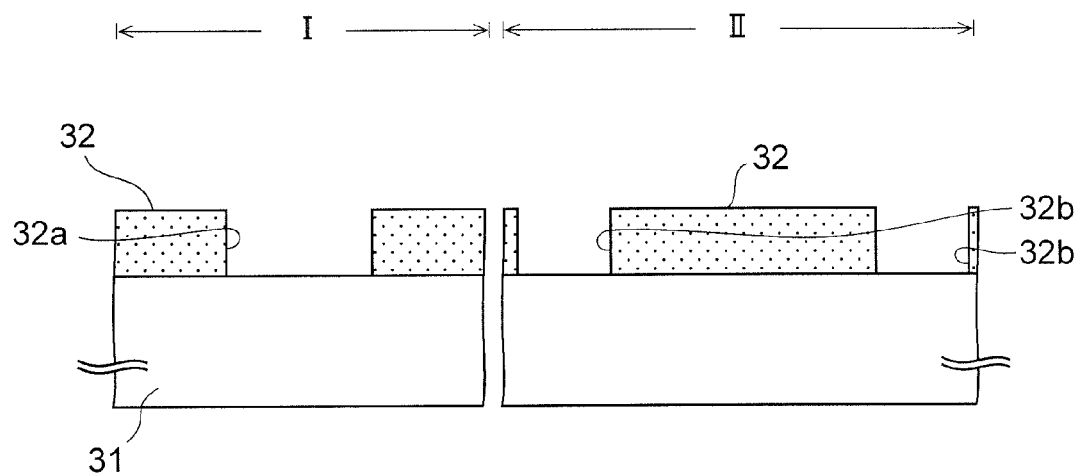
FIGS. 10A to 10M are cross-sectional views of a semiconductor device in the course of manufacturing thereof according to the embodiment.

First, as illustrated in FIG. 10A, a photoresist is applied onto the silicon substrate 31. The photoresist is then exposed and developed and a first resist pattern 32 is thereby formed. The first resist pattern 32 has a first opening 32a in the scribe region I and also has second openings 32b in the chip region II.

Figure 10B:
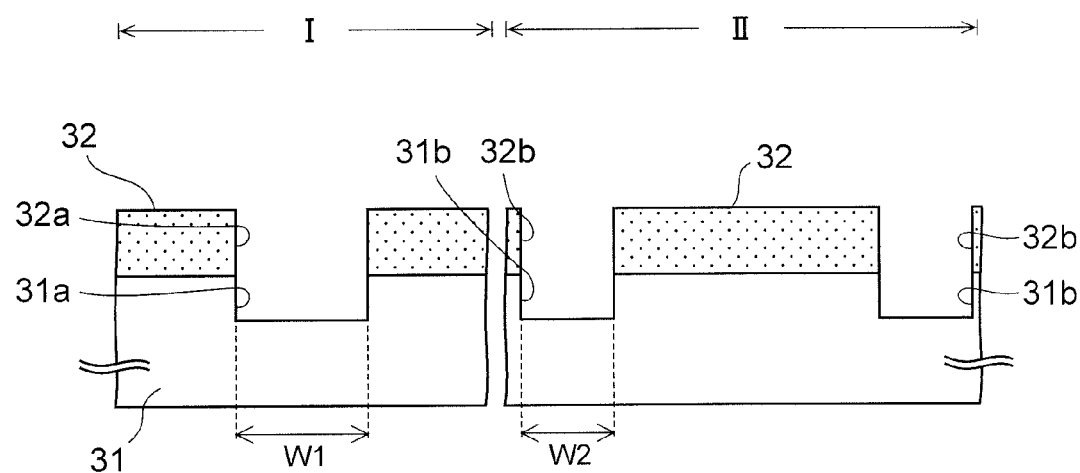

Next, as illustrated in FIG. 10B, the silicon substrate 31 is dry-etched through the first opening 32a and the second openings 32b by performing RIE using, for example, HBr gas or $Cl_2$ gas as an etching gas. By this dry-etching, a recessed portion 31a is formed in the scribe region I and at the same time element isolation trenches 31b having the same depth as the recessed portion 31a are formed in the chip region II.

The depth of the recessed portion 31a and the element isolation trenches 31b is not particularly limited. In the embodiment, the recessed portion 31a and the element isolation trenches 31b are formed to have a depth of 0.25 μm to 0.35 μm.

Moreover, the width W1 of the recessed portion 31a is about 1 μm to about 3 μm and the width W2 of each of the element isolation trenches 31b is about 0.05 μm to about 1.15 μm.

Thereafter, the first resist pattern 32 is removed.

Figure 10C:
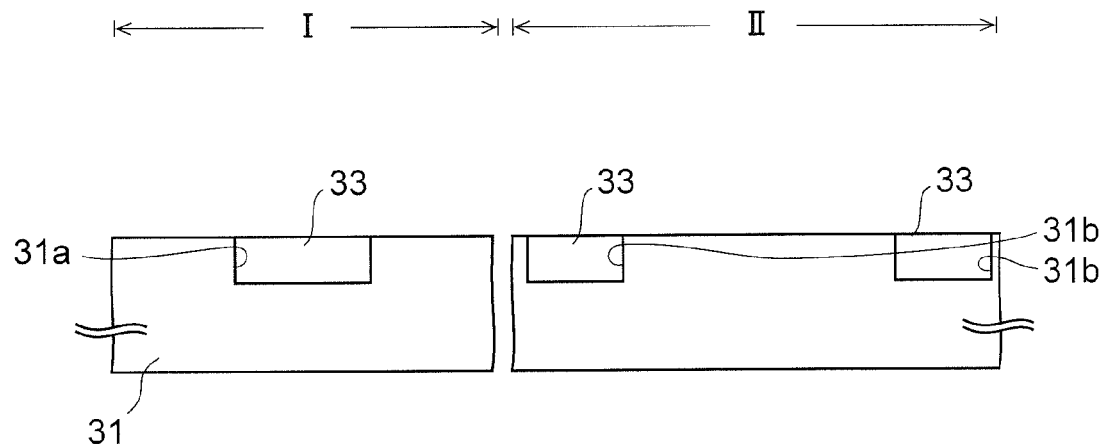

Subsequently, as illustrated in FIG. 10C, an insulating film 33 is formed over the top surface of the silicon substrate 31 and the recessed portion 31a and the element isolation trenches 31b are filled with the insulating film 33. In the embodiment, a silicon oxide film is formed as the insulating film 33 by a CVD method using a silane gas.

Thereafter, the excess insulating film 33 on the top surface of the silicon substrate 31 is removed by the CMP method and the insulating film 33 thereby remains in the recessed portion 31a and the element isolation trenches 31b.

The insulating film 33 remaining in the element isolation trenches 31b is used as an element isolation insulating film for STI (Shallow Trench Isolation). Meanwhile, the insulating film 33 remaining in the recessed portion 31a serves as part of the alignment mark as will be described later.

Figure 10D:
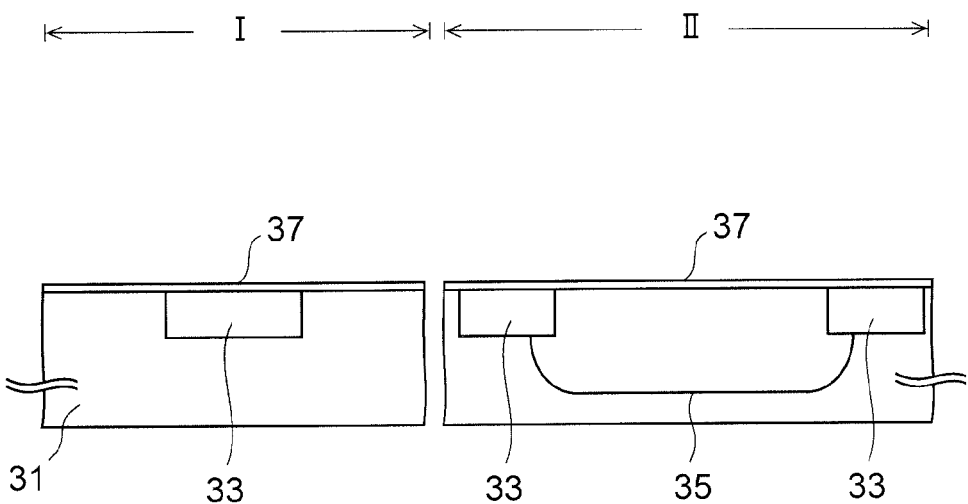

Next, as illustrated in FIG. 10D, a p-well 35 is formed by implanting, for example, ions of boron as a p-type impurity in the chip region II.

Thereafter, the surface of the silicon substrate 31 in the scribe region I and the chip region II is subjected to thermal oxidation and a gate insulating film 37 having a thickness of about 1 nm to about 2 nm is thereby formed.

Figure 10E:
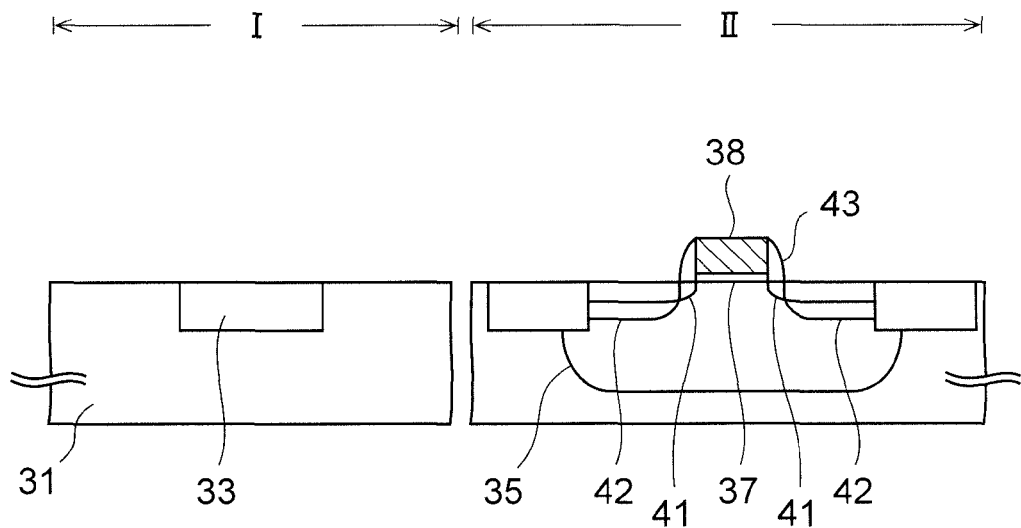

Next, steps performed to obtain a cross-sectional structure illustrated in FIG. 10E are described.

First, a polycrystalline silicon film is formed on the gate insulating film 37 and is then patterned. Thereby, a gate electrode 38 is formed and the gate insulating film 37 remains under the gate electrode 38.

Then, n-type source and drain extensions 41 are formed in the silicon substrate 31, on sides of the gate electrode 38 by implanting ions.

Thereafter, an insulating film is formed over the top surface of the silicon substrate 31 and is etched back to form insulating side walls 43 on sides of the gate electrode 38. The insulating film is a silicon oxide film formed by the CVD method, for example.

Subsequently, an n-type impurity such as phosphorus is introduced into the silicon substrate 31 by performing ion implantation using the insulating side walls 43 and the gate electrode 38 as a mask, and n-type source and drain regions 42 are formed beside the gate electrode 38.

Figure 10F:
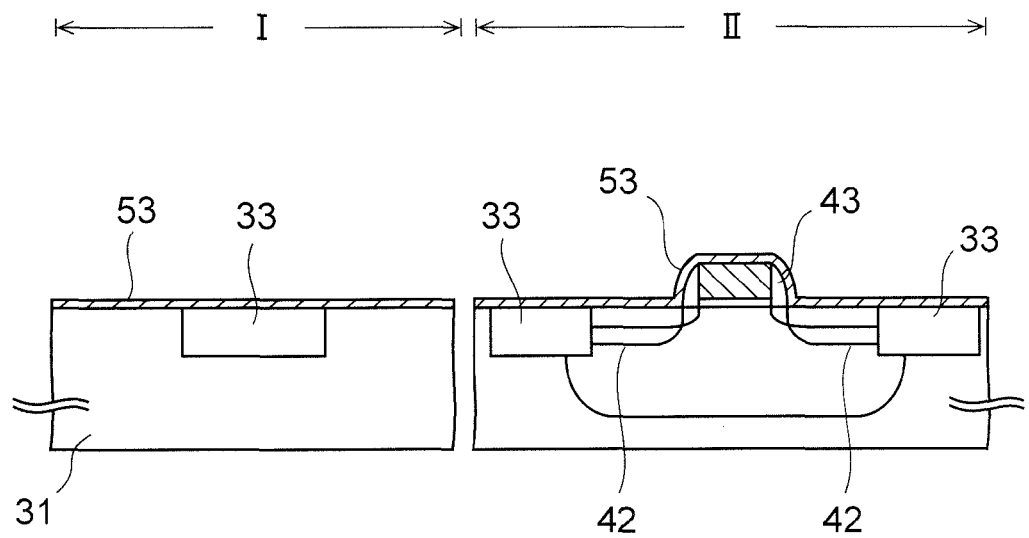

Next, as illustrated in FIG. 10F, a cobalt film is formed as a metal film 53 by a sputtering method to have a thickness of about 3 nm to about 5 nm on the surfaces respectively of the insulating film 33 and the silicon substrate 31. A nickel film may be formed as the metal film 53 instead of the cobalt film.

Figure 10G:
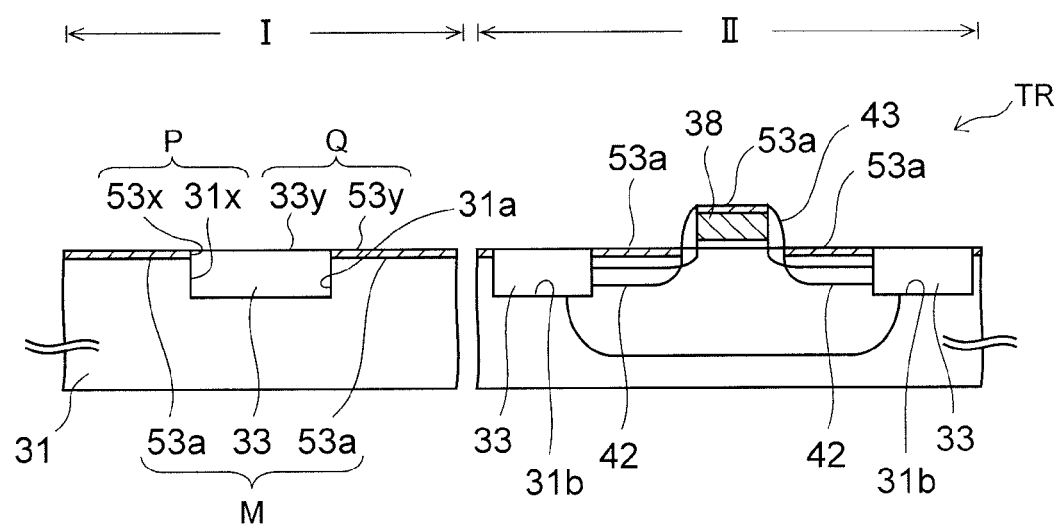

Next, as illustrated in FIG. 10G, the metal film 53 and silicon are reacted with each other by RTA in which the substrate temperature is set to about 500° C. to about 600° C. in a nitrogen atmosphere. In the scribe region I, the metal film 53 is thus selectively silicided by reacting with the underlying silicon substrate 31 and a silicide layer 53a is thereby formed.

The metal film 53 on the insulating film 33 does not react with silicon and is thereby not silicided.

Moreover, in the chip region II, the metal film 53 on and beside the gate electrode 38 reacts with silicon and is formed into the silicide layer 53a.

Thereafter, the metal film 53 on the insulating film 33 which remains unreacted is removed by wet-etching.

In the silicide layer 53a formed as described above, the silicide layer 53a formed in the surface of the silicon substrate 31 beside the gate electrode 38 has a role of reducing the resistances of the n-type source and drain regions 42.

An alignment mark M formed of the silicide layer 53a and the insulating film 33 adjacent thereto is formed in the scribe region I by the steps described so far.

In the alignment mark M, each of side surfaces 31x of the recessed portion 31a and a corresponding one of side surfaces 53x of the silicide layer 53a form a continuous single plane P. Moreover, a top surface 53y of the silicide layer 53a and a top surface 33y of the insulating film 33 form a continuous single plane Q.

Meanwhile, a basic structure of a MOS transistor TR including the gate electrode 38 and the like is completed in the chip region II. The MOS transistor TR includes various device patterns such as the silicide layer 53a and the insulating film 33 functioning as the element isolation insulating film, in addition to the gate electrode 38.

In the embodiment, the alignment mark M is formed in the scribe region I by using the insulating film 33 and the silicide layer 53a which are each one of the above device patterns. Accordingly, no step dedicated to formation of the alignment mark M is performed and steps for manufacturing a semiconductor device may be simplified.

The silicide layer 53a in the scribe region I and the silicide layer 53a in the chip region II are isolated from each other by the element isolation trenches 31b in the chip region II and the insulating film 33 in the element isolation trenches 31b and are thereby not electrically connected to each other.

Figure 11:
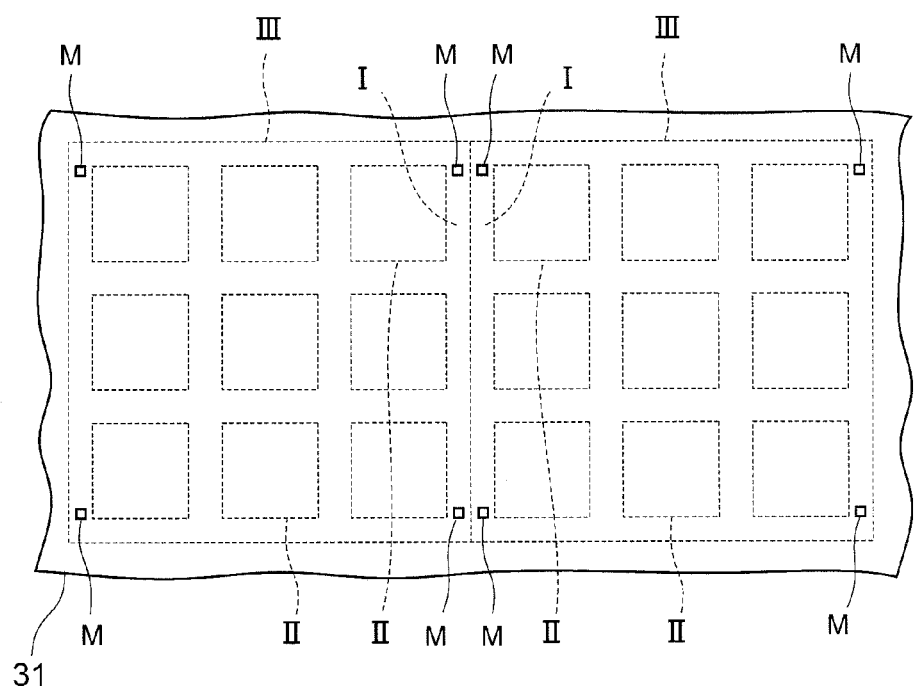
FIG. 11 is an enlarged plan view illustrating an example of a position where an alignment mark is formed in the embodiment.

The position where the alignment mark M is formed in the scribe region I is not particularly limited. FIG. 11 is an enlarged plan view illustrating an example of the position where the alignment mark M is formed. In the example, each alignment mark M is disposed in the scribe region I between two adjacent chip regions II.

Figure 10H:
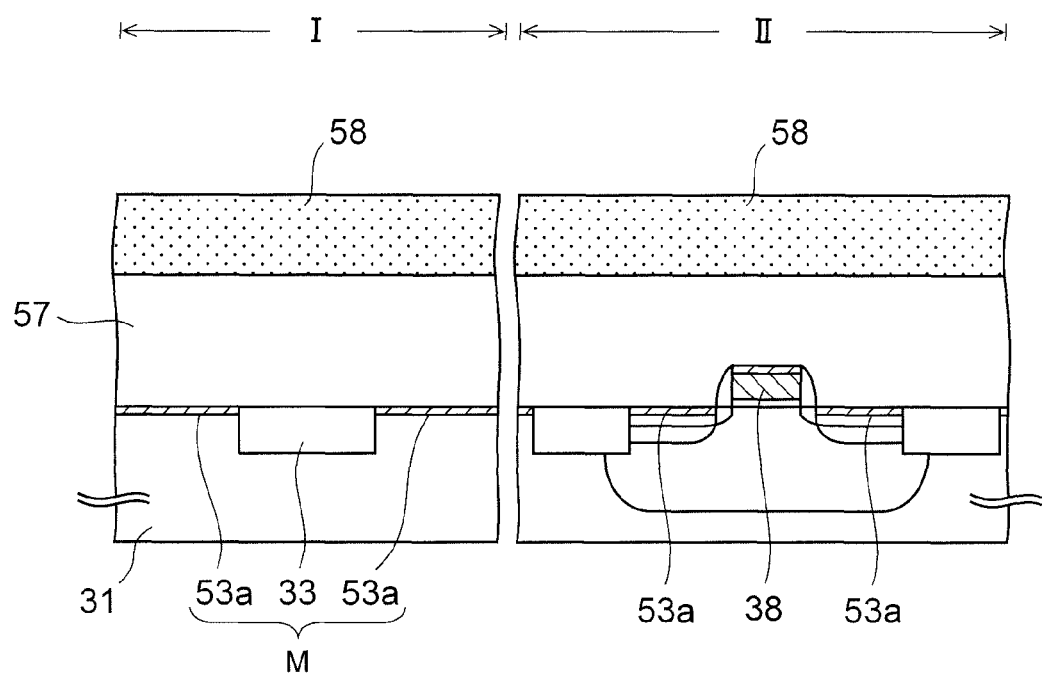

Then, as illustrated in FIG. 10H, a silicon oxide film is formed as an interlayer insulating film 57 by the CVD method to have a thickness of about 600 nm to about 700 nm in the scribe region I and the chip region II. Thereafter, an electron beam resist is applied onto the interlayer insulating film 57 and is baked to form a resist film 58.

Figure 10I:
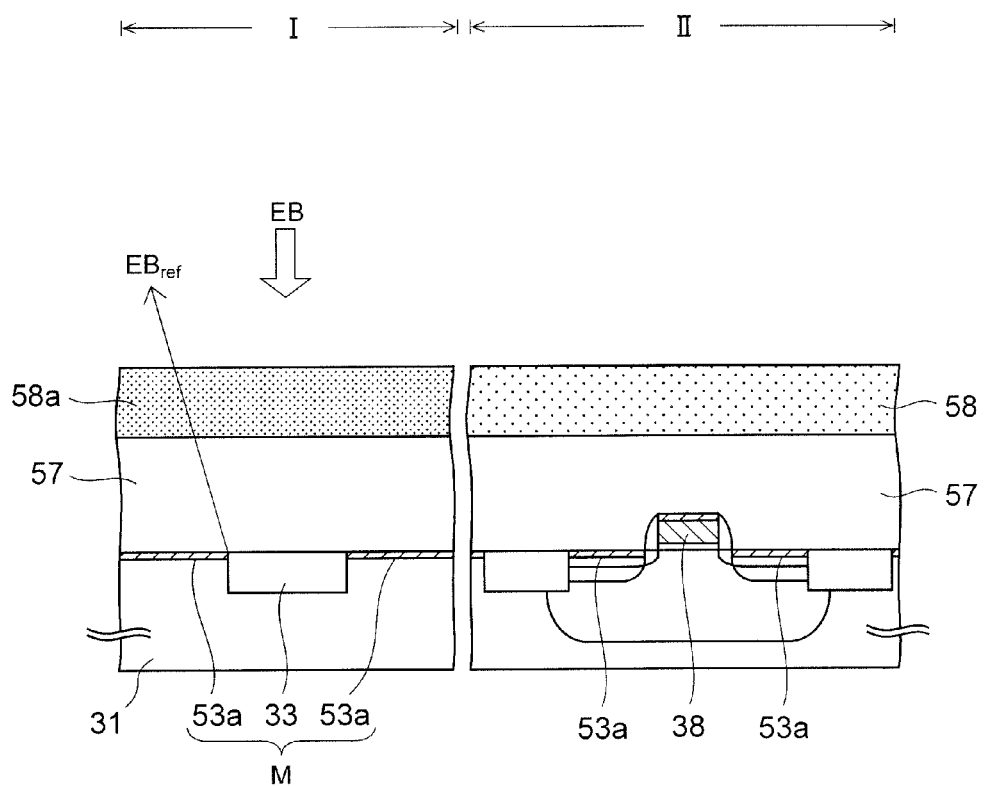

Next, steps performed to obtain a cross-sectional structure illustrated in FIG. 10I are described.

First, the silicon substrate 31 is placed on the X-Y stage 129 of the electron beam exposure apparatus described in FIG. 8. Thereafter, the pressure inside the electron optical system column 113 is reduced to a predetermined pressure or lower.

Then, as illustrated in FIG. 10I, the electron beam EB is scanned over the alignment mark M with the resist film 58 and the interlayer insulating film 57 in between, and reflected electrons $EB_{ref}$ from the alignment mark M is measured with the detector 119. Although the method of scanning is not particularly limited, in the embodiment, the electron beam EB is deflected by the deflector 115 (see FIG. 8) with the silicon substrate 31 fixed.

Figure 12:
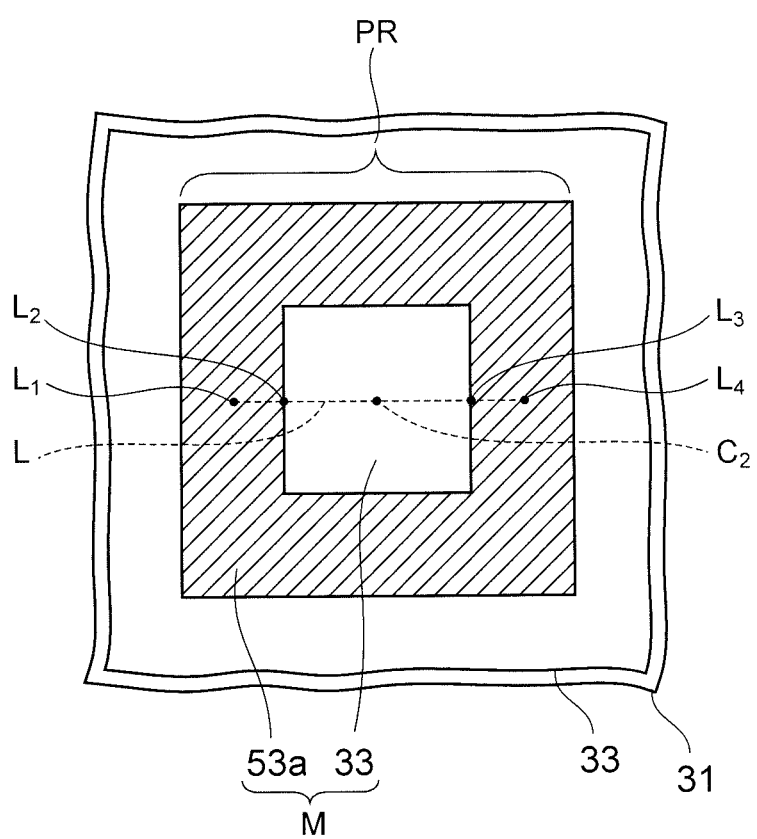
FIG. 12 is a plan view of the alignment mark according to the embodiment.

FIG. 12 is a plan view of the alignment mark M.

As illustrated in FIG. 12, the alignment mark M is formed in a partial region PR of the silicon substrate 31 and the outline of the alignment mark M is defined by the insulating film 33.

The insulating film 33 forming the alignment mark M has a rectangular shape in the plan view and the silicide layer 53a surrounding the insulating film 33 has a rectangular outer shape in the plan view.

In the embodiment, the scanning line L is set to pass the center $C_2$ of the alignment mark M and the electron beam EB is scanned along the scanning line L. In FIG. 12, both ends of the scanning line L are denoted by $L_1$ and $L_4$ and boundaries between the insulating film 33 and the silicide layer 53a are denoted by $L_2$ and $L_3$.

Figure 13A:
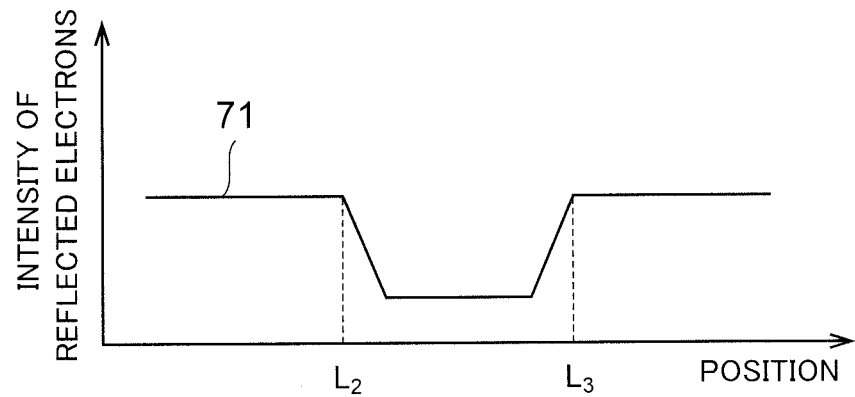
FIG. 13A illustrates a waveform representing the intensity of reflected electrons from the alignment mark according to the embodiment.

FIG. 13A illustrates an example of a waveform 71 outputted from the detector 119 when the electron beam EB is scanned over the alignment mark M. The horizontal axis in FIG. 13A represents the position of the electron beam EB and the vertical axis represents the intensity of the reflected electrons $EB_{ref}$.

As illustrated in FIG. 13A, when the electron beam EB is scanned along the scanning line L, the intensity of the reflected electrons $EB_{ref}$ changes greatly at the boundaries $L_2$ and $L_3$ due to difference in materials between the insulating film 33 and the silicide layer 53a.

Figure 13B:
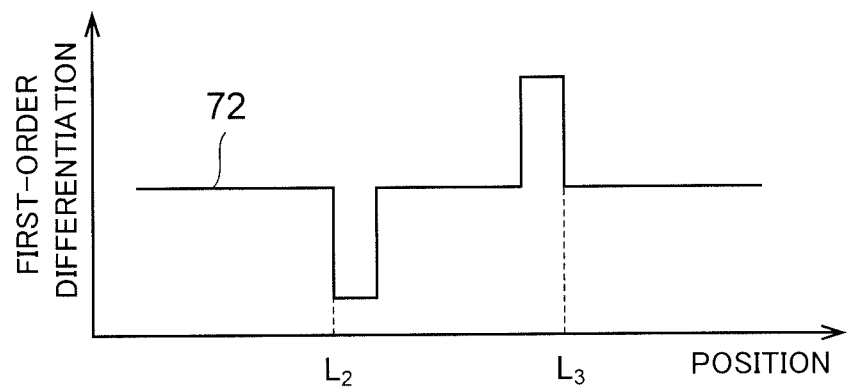
FIG. 13B illustrates a waveform obtained by performing first-order differentiation of the waveform of FIG. 13A with respect to position.
Figure 13C:
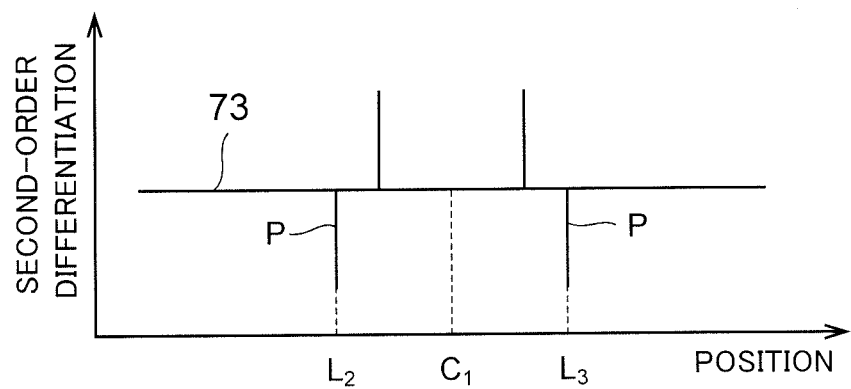
FIG. 13C illustrates a waveform obtained by performing second-order differentiation of the waveform of FIG. 13A with respect to position.

The waveform 71 is converted to a digital value by the AD convertor 124a in FIG. 8. The waveform 71 is thereafter subjected to first-order differentiation by the waveform analyzing part 124 and a waveform 72 illustrated in FIG. 13B is thereby obtained. Then, the waveform analyzing part 124 performs second-order differentiation of the waveform 71 with respect to position to generate a waveform 73 illustrated in FIG. 13C.

Since the amounts of change of the waveform 71 at the boundaries $L_2$ and $L_3$ are large as described above, sharp peaks P appear in the waveform 73 at boundaries $L_2$ and $L_3$.

The waveform analyzing part 124 recognizes a midpoint $C_1$ of the two peaks P indicating the boundaries $L_2$ and $L_3$ as the center of the valley of the waveform 71, i.e. the center $C_2$ (see FIG. 12) of the alignment mark M, and outputs position data $D_0$ indicating the center position to the digital control system 106.

In the embodiment, since the insulating film 33 of the alignment mark M remains without being removed by etching as illustrated in FIG. 10G, shoulder portions of the recessed portion 31a are not chamfered due to etching. Accordingly, the two peaks P are less likely to shift to right or left due to chamfered shoulder portions and the amount of misalignment between the midpoint $C_1$ of the peaks P and the center $C_2$ of the alignment mark M may be reduced to a small amount.

Thereafter, the position data $D_0$ is inputted into the pattern generation circuit 108 of the digital control system 106 via the bus 121, and the pattern generation circuit 108 generates the aforementioned deflection correction data $D_c$ on the basis of the position data $D_0$.

Then, in the exposure hereafter, the deflection data D is corrected by adding the deflection correction data $D_c$ to the deflection data D outputted from the control work station 102, and the electron beam EB is deflected based on data obtained from this correction. In the embodiment, such correction of the deflection data D is also referred to as correction of misalignment between the electron beam exposure apparatus and the silicon substrate 31.

When the electron beam EB is scanned over the scribe region I as described above, a first exposed portion 58a is formed in the resist film 58 in the scribed region I as illustrated in FIG. 10I.

Thereafter, deflection data D for drawing a contact hole is generated in the control work station 102 with the silicon substrate 31 placed on the X-Y stage 129 (see FIG. 8). Then, the electron beam EB is deflected by an amount obtained by adding the correction data $D_c$ to this deflection data D.

Figure 10J:
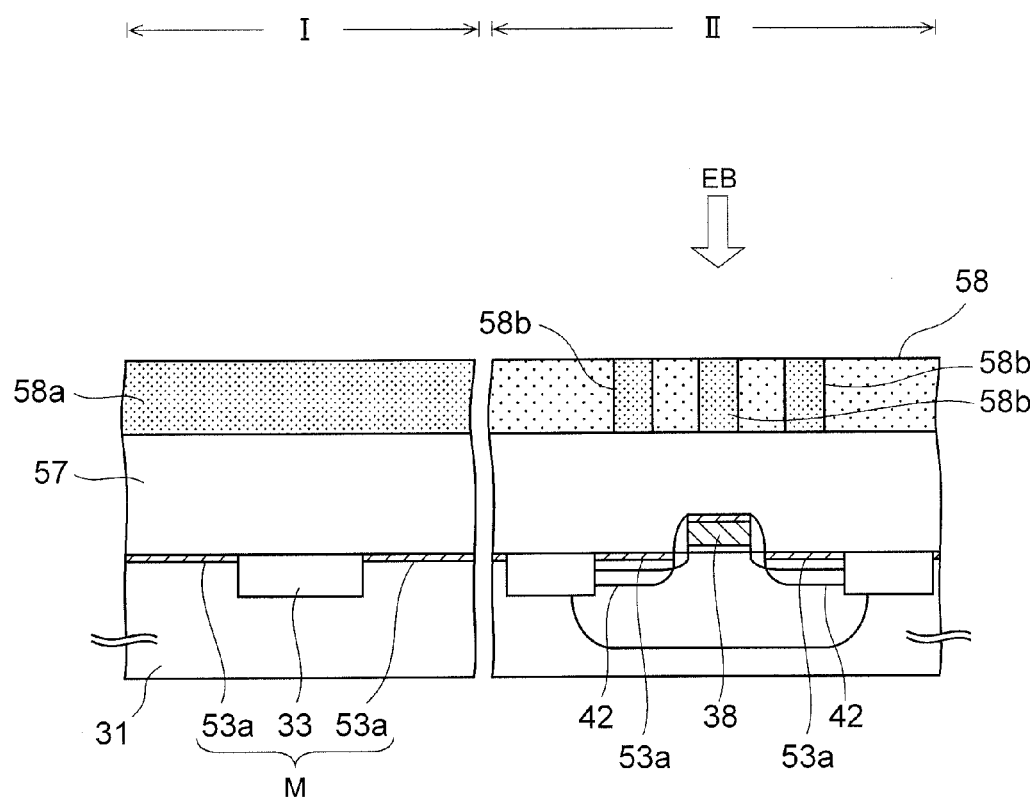

As illustrated in FIG. 10J, the resist film above the silicide layer 53a in the chip region II is thus exposed by the electron beam EB which has been subjected to the correction of misalignment. As a result, a second exposed portion 58b which is accurately aligned with respect to the underlying silicide layer 53a is formed in the resist film 58.

Particularly, in the embodiment, the alignment mark M and the silicide layer 53a in the chip region II are simultaneously formed in the same layer. Accordingly, the second exposed portion 58b and the silicide layer 53a thereunder may be directly aligned with respect to each other by performing alignment using the alignment mark M.

Figure 10K:
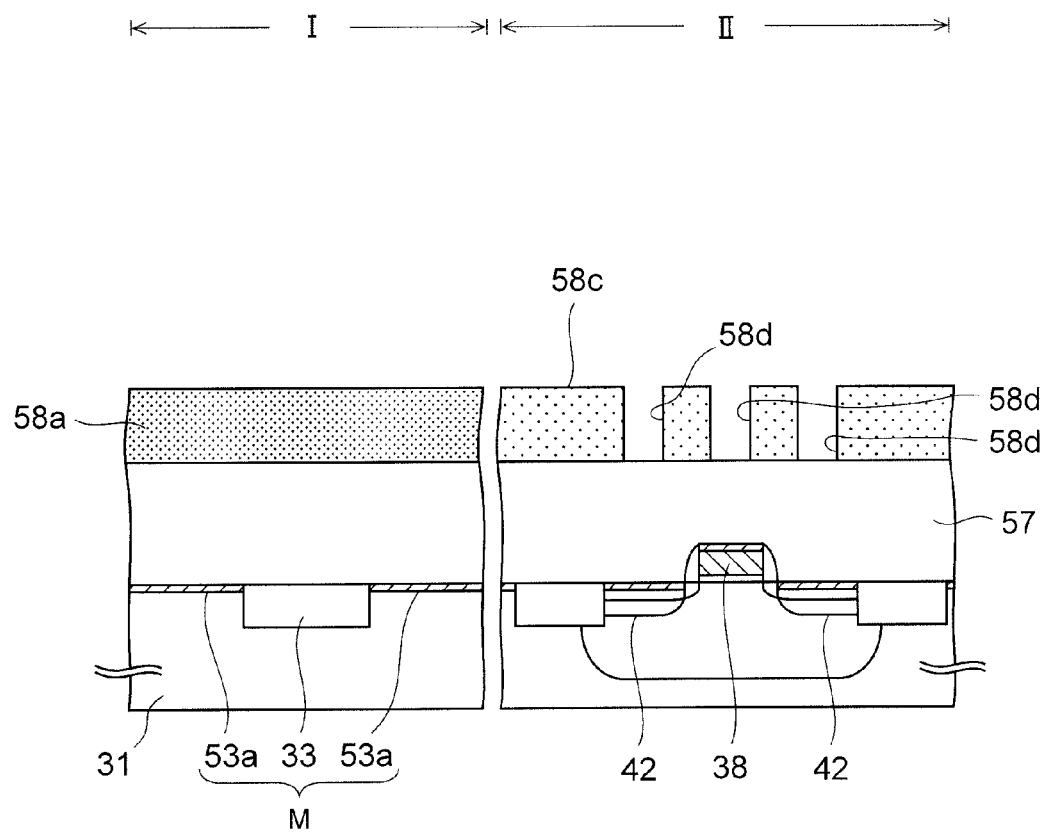

Subsequently, as illustrated in FIG. 10K, the silicon substrate 31 is taken out from the electron beam exposure apparatus described above and the resist film 58 is developed. The second exposed portion 58b is thereby removed and a second resist pattern 58c including a plurality of third openings 58d having hole shapes is formed.

Since the first exposed portion 58a is excessively exposed when the electron beam EB is scanned over the alignment mark M in the step of FIG. 10I, the first exposed portion 58a does not dissolve into developer but remains in the scribe region I even after the development.

Figure 10L:
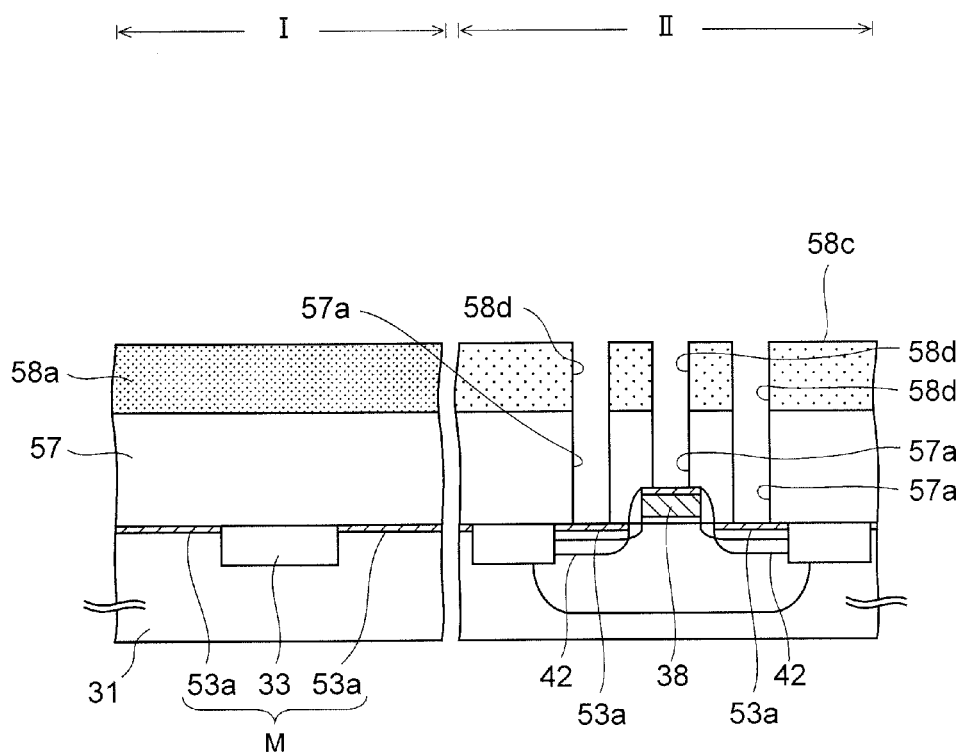

Next, as illustrated in FIG. 10L, the interlayer insulating film 57 is dry-etched through the third openings 58d by the RIE, and contact holes 57a are thereby formed respectively as the device pattern on the n-type source and drain regions 42 and the gate electrode 38. Although an etching gas used in the RIE is particularly not limited, a fluorocarbon gas such as $C_4F_6$ gas is used as the etching gas in the embodiment.

Thereafter, the second resist pattern 58c and the first exposed portion 58a are removed.

Figure 10M:
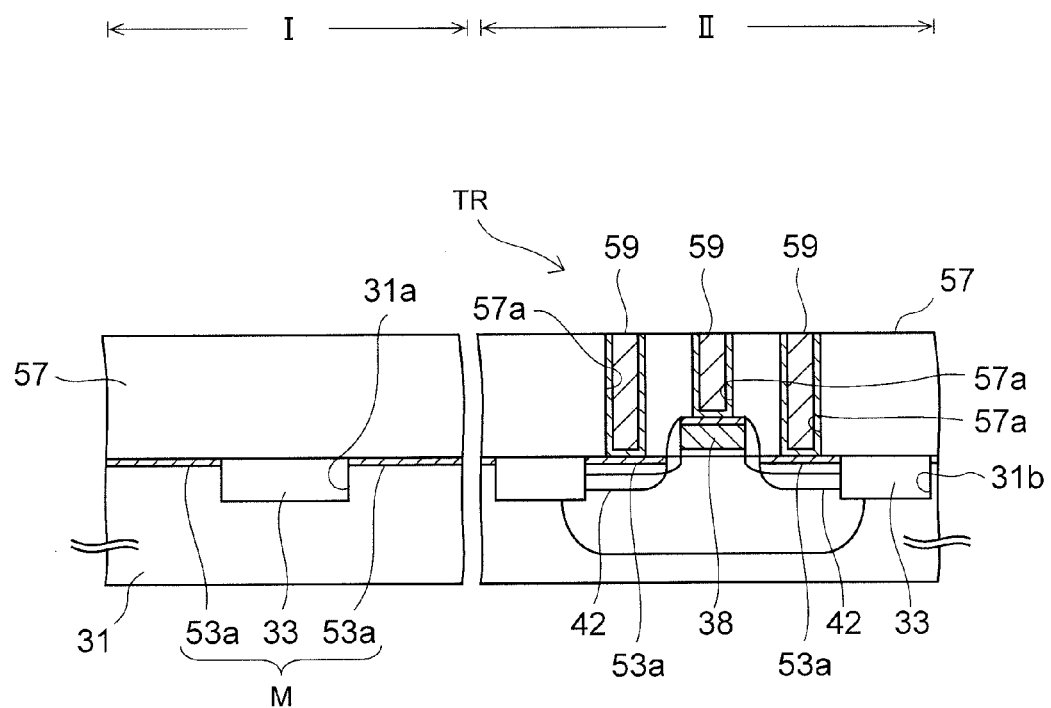

Next, steps performed to obtain a cross-sectional structure illustrated in FIG. 10M are described.

First, a titanium film and a titanium nitride film are formed as a glue film in this order by the sputtering method on a top surface of the interlayer insulating film 57 and inner surfaces of the contact holes 57a. Then, a tungsten film is formed on the glue film by the CVD method and the contact holes 57a are filled with the tungsten film.

Thereafter, the excess glue film and the excess tungsten film on the top surface of the interlayer insulating film 57 are removed by the CMP method. The glue film and the tungsten film thus remain in the contact holes 57a as conductive plugs 59.

A basic structure of a semiconductor device which includes the alignment mark M in the scribe region I and in which the transistor TR is formed in the chip region II is completed by the steps described so far.

Thereafter, a multilayer wiring layer is formed on the conductive plugs 59 and then a step of dicing the silicon substrate 31 into the chip regions II is performed. Details of this step are omitted.

In the embodiment described above, as described with reference to FIG. 10G, the silicide layer 53a and the insulating film 33 are formed as the alignment mark M in the scribe region I. The silicide layer 53a and the insulating film 33 are both formed as the device pattern in the chip region II. Accordingly, no step dedicated to formation of the alignment mark M is performed in the embodiment and steps for manufacturing a semiconductor device may be simplified.

Moreover, as illustrated in FIG. 10G, the alignment mark M and the silicide layer 53a in the chip region II are formed simultaneously in the same layer in the embodiment. Accordingly, the second exposed portion 58b and the silicide layer 53a thereunder may be directly aligned with respect to each other in the step of FIG. 10J by using the alignment mark M for the alignment. As a result, accuracy in the alignment between the silicide layer 53a and the contact holes 57a (see FIG. 10L) corresponding to the second exposed portion 58b is improved.

Furthermore, unlike in FIGS. 1E and 4D, the insulating film 33 in the recessed portion 31a in the scribe region I is not etched but used as the alignment mark M in the embodiment. Thus, the shoulder portions of the recessed portion 31a are not chamfered due to etching. Accordingly, the positions of the peaks P in the waveform 73 are less likely to shift to right or left due to chamfered shoulder portions and the center $C_2$ of the alignment mark M may be accurately found from the midpoint $C_1$ of the two peaks P.

Although the details of the embodiment have been described above, the embodiment is not limited to one described above.

Figure 14:
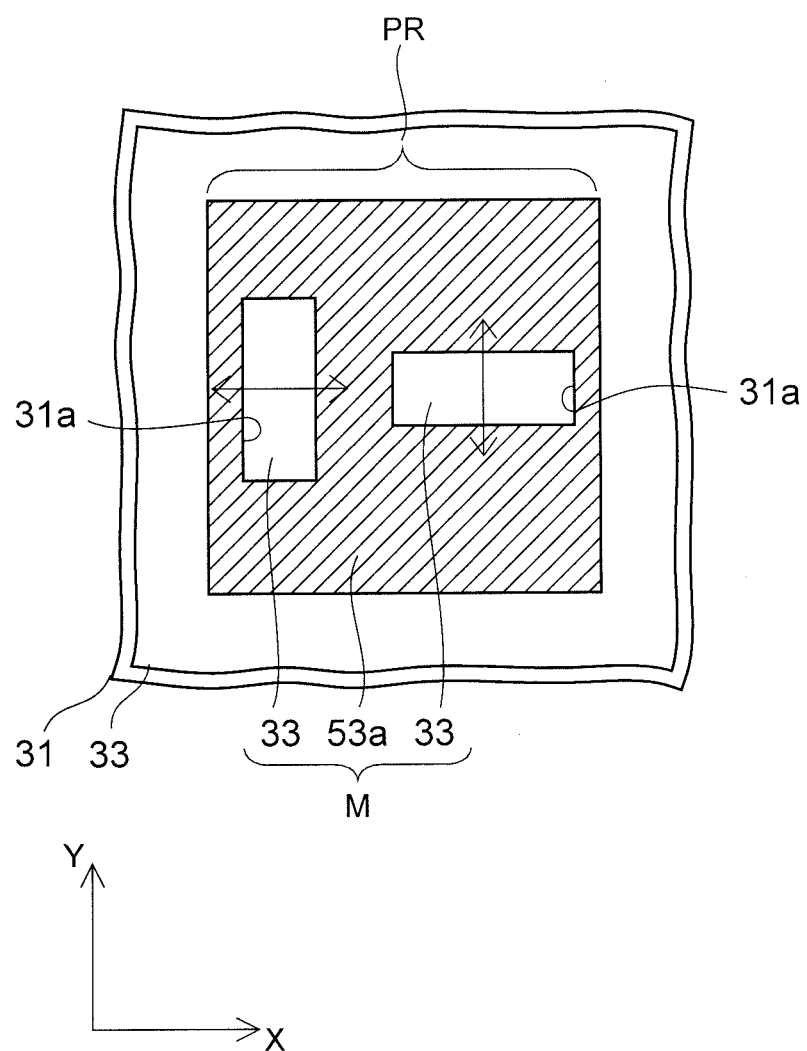
FIG. 14 is a plan view illustrating another example of the alignment mark according to the embodiment.

For example, the shape of the alignment mark M is not limited to the shape given as an example in FIG. 12 and may be a shape illustrated in FIG. 14.

FIG. 14 is a plan view illustrating another example of the alignment mark M.

In this example, two rectangular recessed portions 31a are provided in the partial region PR of the silicon substrate 31 in which the silicide layer 53a is formed, and the recessed portions 31a are filled with the insulating film 33. Moreover, one of the recessed portions 31a has a shape turned 90° with respect to the other recessed portion 31a in the plan view.

In this case, the electron beam EB is scanned over the two rectangular insulating films 33 in the directions of the shorter sides thereof as indicated by the arrows, the insulating films 33 arranged respectively in an X direction and a Y direction. The electron beam exposure device and the silicon substrate 31 are thereby aligned with respect to each other.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
    forming a first recessed portion in a first region between a plurality of chip regions on a semiconductor substrate;
    forming a first insulating film in the first recessed portion;
    after forming the first insulating film, forming a first silicide layer directly on the semiconductor substrate in the first region, the first silicide layer being in contact with the first insulating film; and
    performing alignment between an electron beam exposure apparatus and the semiconductor substrate by using the first insulating film and the first silicide layer as an alignment mark, wherein
    the forming the first silicide layer includes:
    forming a metal film over the semiconductor substrate and the first insulating film; and
    forming the first silicide layer directly on the semiconductor substrate by heating the metal film; and
    removing the metal film on the first insulating film, and
    the performing alignment between the electron beam exposure apparatus and the semiconductor substrate is performed in such a way that the electron beam exposure apparatus scans an electron beam over the alignment mark and thereby detects a boundary where the first silicide layer is in contact with the first insulating film.

2. The method of manufacturing a semiconductor device according to claim 1, wherein the first region is a scribe region.

3. The method of manufacturing a semiconductor device according to claim 1, the method further comprising:
    forming a gate insulating film on a surface of the semiconductor substrate in each of the chip regions; and
    forming a gate electrode over the gate insulating film, wherein
    in the heating the metal film, a second silicide layer is formed over the gate electrode, and a third silicide layer is formed on the semiconductor substrate at both side of the gate electrode.

4. The method of manufacturing a semiconductor device according to claim 1, wherein
    in the forming the first recessed portion, a second recessed portion is formed in each of the chip regions of the semiconductor substrate, and
    in the forming the first insulating film, a second insulating film is formed also in the second recessed portion.

5. The method of manufacturing a semiconductor device according to claim 1, the method further comprising:
    forming a film over the semiconductor substrate;
    forming a resist film over the film;
    exposing the resist film by using the electron beam exposure apparatus after the performing alignment between the electron beam exposure apparatus and the semiconductor substrate;
    forming a resist pattern by developing the resist film after the exposure; and
    forming a device pattern in the film by etching the film with the resist pattern used as a mask.

6. The method of manufacturing a semiconductor device according to claim 1, wherein
    the first insulating film in the first recessed portion has a rectangular shape in a plan view, and
    the first silicide layer has a rectangular shape surrounding the first insulating film in a plan view.

7. The method of manufacturing a semiconductor device according to claim 1, wherein
    the first recessed portion comprises a first part and a second part, and the first part has a shape turned 90° with respect to the second part in a plan view.

8. The method of manufacturing a semiconductor device according to claim 1, wherein a top surface of the first silicide layer and a top surface of the first insulating film form a continuous single plane.

* * * * *